(12) United States Patent
Raaijmakers et al.

(10) Patent No.: US 6,831,315 B2
(45) Date of Patent: Dec. 14, 2004

(54) CONFORMAL THIN FILMS OVER TEXTURED CAPACITOR ELECTRODES

(75) Inventors: Ivo Raaijmakers, Bilthoven (NL); Suvi P. Haukka, Helsinki (FI); Ernst H. A. Granneman, Hilversum (NL)

(73) Assignee: ASM International N.V. (NL)

( * ) Notice: Subject to any disclaimer, the term of this patent is extended or adjusted under 35 U.S.C. 154(b) by 0 days.

(21) Appl. No.: 09/791,072

(22) Filed: Feb. 22, 2001

(65) Prior Publication Data

US 2001/0024387 A1 Sep. 27, 2001

Related U.S. Application Data

(62) Division of application No. 09/452,844, filed on Dec. 3, 1999.

(51) Int. Cl.[7] .............................................. H01L 27/108
(52) U.S. Cl. ...................... 257/296; 257/308; 257/309; 257/310; 257/311
(58) Field of Search ................................ 257/296, 308, 257/309, 310, 311

(56) References Cited

U.S. PATENT DOCUMENTS

| | | | |
|---|---|---|---|
| 4,058,430 A | 11/1977 | Suntola et al. | |
| 4,747,367 A | 5/1988 | Posa | |
| 4,761,269 A | 8/1988 | Conger et al. | |
| 5,071,670 A | 12/1991 | Kelly | |
| 5,182,232 A | 1/1993 | Chhabra et al. | 437/200 |
| 5,187,638 A | 2/1993 | Sandhu et al. | 361/313 |
| 5,418,180 A | 5/1995 | Brown | |
| 5,504,041 A | 4/1996 | Summerfelt | 437/235 |
| 5,519,234 A | 5/1996 | Paz de Araujo et al. | 257/295 |
| 5,554,557 A | 9/1996 | Koh | 437/52 |
| 5,576,928 A | 11/1996 | Summerfelt | 361/321.1 |
| 5,608,247 A | 3/1997 | Brown | |

(List continued on next page.)

FOREIGN PATENT DOCUMENTS

JP     2000-307078 A   * 11/2000     ......... H01L/27/108

OTHER PUBLICATIONS

Fazan et al. "A High–C Capacitor (20.4fF/um) with Ultrathin CVD–Ta2O5) Films Deposited on Rugged Poly–Si for High Density DRAMs," IEDM 1992, p. 263–266.*

Abeles, et al., "Amorphous Semiconductor Superlattices," Physical Review Letters, vol. 51, No. 21, Nov. 21, 1983, p. 2003–2006.

Adler et al., "Single–Device Memory Cell Having A Transistor Metal Silicate Capacitor Dielectric And Ion–Implanted Storage Node," IBM Technical Disclosure Bulletin, vol. 25, No. 7A, Dec. 1982, p. 3494–3495.

(List continued on next page.)

*Primary Examiner*—Allan R. Wilson
*Assistant Examiner*—Matthew E. Warren
(74) *Attorney, Agent, or Firm*—Knobbe, Marrens, Olson & Bear, LLP

(57) ABSTRACT

Method and structures are provided for conformal capacitor dielectrics over textured silicon electrodes for integrated memory cells. Capacitor structures and first electrodes or plates are formed above or within semiconductor substrates. The first electrodes include hemispherical grain (HSG) silicon for increasing the capacitor plate surface area. The HSG topography is then exposed to alternating chemistries to form monolayers of a desired dielectric material. Exemplary process flows include alternately pulsed metal organic and oxygen source gases injected into a constant carrier flow. Self-terminated metal layers are thus reacted with oxygen. Near perfect step coverage allows minimal thickness for a capacitor dielectric, given leakage concerns for particular materials, thereby maximizing the capacitance for the memory cell and increasing cell reliability for a given memory cell design. Alternately pulsed chemistries are also provided for depositing top electrode materials with continuous coverage of capacitor dielectric, realizing the full capacitance benefits of the underlying textured morphology.

4 Claims, 12 Drawing Sheets

U.S. PATENT DOCUMENTS

| | | | | |
|---|---|---|---|---|
| 5,619,393 | A | | 4/1997 | Summerfelt et al. ..... 361/321.1 |
| 5,622,893 | A | | 4/1997 | Summerfelt et al. ........ 438/396 |
| 5,637,527 | A | | 6/1997 | Baek .......................... 438/396 |
| 5,650,351 | A | * | 7/1997 | Wu .............................. 437/52 |
| 5,688,724 | A | | 11/1997 | Yoon et al. |
| 5,729,054 | A | | 3/1998 | Summerfelt et al. ........ 257/751 |
| 5,754,390 | A | | 5/1998 | Sandhu et al. ........... 361/321.4 |
| 5,769,950 | A | | 6/1998 | Takasu et al. |
| 5,869,860 | A | | 2/1999 | Widmann et al. ........... 257/304 |
| 5,916,365 | A | | 6/1999 | Sherman |
| 5,923,056 | A | * | 7/1999 | Lee et al. .................... 257/192 |
| 6,037,206 | A | | 3/2000 | Huang et al. ................ 438/240 |
| 6,084,765 | A | * | 7/2000 | Lee ............................. 361/311 |
| 6,090,659 | A | | 7/2000 | Laibowitz et al. .......... 438/240 |
| 6,107,136 | A | | 8/2000 | Melnick et al. |
| 6,184,074 | B1 | | 2/2001 | Crenshaw et al. .......... 438/238 |
| 6,200,897 | B1 | | 3/2001 | Wang et al. ................. 438/692 |
| 6,207,487 | B1 | * | 3/2001 | Kim et al. ................... 438/238 |
| 6,281,543 | B1 | * | 8/2001 | Al-Shareef et al. ......... 257/309 |
| 6,319,769 | B1 | * | 11/2001 | Cho ............................ 438/255 |
| 6,335,240 | B1 | * | 1/2002 | Kim et al. ................... 438/253 |
| 6,342,712 | B1 | * | 1/2002 | Miki et al. ................... 257/295 |

OTHER PUBLICATIONS

Desu, et al., "Enhanced dielectric properties of modified Ta2O5 thin films," Mat. Res. Innovat., vol. 2, 1999, p. 299–302.

Fazan et al., "A High–C Capacitor (20.4 fF/$\mu m^2$) with Ultrathin CVD—Ta2O5 Films Deposited on Rugged Poly–Si for High Density DRAMs," IEDM, 1992, p. 263–266.

Kim et al., "The effects of substrate and annealing ambient on the electrical properties of Ta2O5 thin films prepared by plasma enhanced chemical vapor deposition," Thin Solid Films, vol. 253, 1994, p. 435–439.

Kim et al., "Novel poly–Si/Al2O3/poly–Si Capacitor for High Density DRAMs," 1998 Symposium on VLSI Technology Digest of Technical Papers, p. 52–53.

Kukli et al., "Atomic Layer Epitaxy Growth of Tantalum Oxide Thin Films from Ta(OC$_2$H$_5$)$_5$ and H$_2$O," J. Electrochem. Soc., vol. 142, No. 5, May 1995, p. 1670–1674.

Leskelå, et al., "Atomic Layer Epitaxy in Deposition of Various Oxide and Nitride Thin Films," Journal De Physique IV, vol. 5, Jun. 1995, p. C5–937–C5–951.

Niinistö, et al., "Synthesis of oxide thin films and overlayers by atomic layer epitaxy for advanced applications," Materials Science and Engineering B41, 1996, p. 23–29.

Ritala, et al., "Perfectly Conformal TiN and Al2O3 Films Deposited by Atomic Layer Deposition," Chemical Vapor Deposition, vol. 5, No. 1, 1999, p. 7–9.

Ritala, et al., "Zirconium dioxide thin films deposited by ALE using zirconium tetrachloride as precursor," Applied Surface Science, vol. 75, 1994, p. 333–340.

Sakaue, et al., "Digital Chemical Vapor Deposition of SiO2 Using a Repetitive Reaction of Triethylsilane/Hydrogen and Oxidation," Japanese Journal of Applied Physics, vol. 30, No. 1B, Jan. 1990, p. L124–L127.

Singer, Peter, "Wafer Processing: Atomic Layer Deposition Targets Thin Films," Semiconductor International, vol. 22, No. 10, Sep. 1999, p. 40.

Sneh, et al., "Atomic layer growth of $SiO_2$ on Si(100) using $SiCl_4$ and $H_2O$ in a binary reaction sequence," Surface Science, vol. 334, 1995, p. 135–152.

Tiitta, et al., "Preparation and Characterization of Phosphorus–Doped Aluminum Oxide Thin Films," Materials Research Bulletin, vol. 33, No. 9, 1998, p. 1315–1323.

Vehkamäki, et al., "Growth of $SrTiO_3$ and $BaTiO_3$ Thin Films by Atomic Layer Deposition," Electrochemical and Solid–State Letters, vol. 2, No. 10, 1999.

Wise, et al., "Diethyldiethoxysilane As A New Precursor For $SiO_2$ Growth On Silicon," Mat. Res. Soc. Symp. Proc., vol. 334, 1994, p. 37–43.

Watanabe, H. et al., "A New Cylindrical Capacitor Using Hemispherical Grained Si (HSG–Si) for 26 Mb DRAMs," IEEE, IEDM 1992, pp. 259–262.

John E.J. Schmitz, *Chemical Vapor Deposition of Tungsten and Tungsten Silicides For VLSI/ULSI Applications*, Noyes Publication (1992), pp. 20–30.

* cited by examiner

US 6,831,315 B2

CONFORMAL THIN FILMS OVER TEXTURED CAPACITOR ELECTRODES

REFERENCE TO RELATED APPLICATION

The present application is a divisional of U.S. application Ser. No. 09/452,844, filed Dec. 3, 1999.

FIELD OF THE INVENTION

The invention relates generally to forming thin films over textured bottom electrodes, and more particularly to providing high permittivity dielectric and top electrode materials with near perfect conformability over memory cell bottom electrodes including hemispherical grain (HSG) silicon.

BACKGROUND OF THE INVENTION

When fabricating integrated circuits, layers of insulating, conducting and semiconducting materials are deposited and patterned, layer by layer, to build up the desired circuit. Many types of circuits incorporate capacitors, each of which include a dielectric layer sandwiched two plates or electrodes. Memory chips such as dynamic random access memories (DRAMs), in particular, employ capacitors to store charge in memory cells. Each memory cell can represent one bit of data, where the capacitor can either be charged or discharged to represent logical states.

In accordance with the general trend in the semiconductor industry, integrated circuits are continually being scaled down in pursuit of faster processing speeds and lower power consumption. As the packing density of memory chips continues to increase, each capacitor in the more crowded memory cell must still maintain a certain minimum charge storage to ensure reliable operation of the memory cell without excessive refresh cycling. It is thus important that, with progressive generations of circuit design; capacitor designs achieve ever higher stored charge for the shrinking area of the chip (or footprint) allotted to each cell. Techniques have therefore been developed to increase the total charge capacity of the cell capacitor for a given footprint allotment.

The amount of charge stored on the capacitor is proportional to the capacitance, $C=kk_0 A/d$, where k is the permittivity or dielectric constant of the capacitor dielectric between two electrodes; $k_0$ is the vacuum permittivity; A is the electrode surface area, and d is the spacing between the electrodes, also representing the thickness of the interelectrode dielectric. Early techniques have focused on increasing the effective surface area of the electrodes by creating folding structures for stacked capacitors or trench capacitors. Trench capacitors are formed within the semiconductor substrate in which the transistors are generally formed, whereas stacked capacitors are formed above the transistors. Such structures better utilize the available chip area by creating three-dimensional shapes to which the conductive electrodes and capacitor dielectric conform.

FIG. 1A illustrates a memory cell 10 incorporating an exemplary stacked capacitor above a semiconductor substrate 12. The illustrated capacitor design is known in the industry as a "stud" capacitor. Transistors are first formed, including gate stacks 14 formed over the substrate 12 and heavily doped active areas 16 within the substrate 12. A contact 18 reaches through an insulating layer 20 that overlies the transistors. This contact 18 electrically connects a lower or storage electrode 22, of the capacitor 11, which is formed over the insulating layer 20. The stud shape presents a larger surface area for the lower electrode 22, relative to the footprint of the substrate over which it is formed. A thin capacitor dielectric layer 24 coats the lower or bottom electrode 22, and an upper or top electrode 26 is formed over the capacitor dielectric 24.

FIG. 1B, for example, illustrates a memory cell 10a with a different stacked capacitor design, where like parts are referred to by like reference numerals. As in FIG. 1B, a capacitor 11a is shown over a substrate 12, including transistors covered with an insulating layer 20. The capacitor 11a, however, conforms to a generally cylindrical shape. In particular, a lower or bottom electrode 22a, electrically connecting to an underlying transistor by the contact 18, conforms to a cylinder, presenting a larger surface area relative to the footprint of the substrate over which it is formed. With both inner and outer surfaces exposed, as shown, the bottom 22a has an even larger effective surface area than the corresponding bottom electrode 22 of the stud capacitor 11 in FIG. 1A. A thin capacitor dielectric layer 24a coats the bottom electrode 22a, and a top electrode 26a is formed over the capacitor dielectric 24a. "Crown" structures are similar to the illustrated cylindrical capacitor 11a of FIG. 1B but further include multiple concentric cylinders Other stacked capacitor designs resemble mushroom shapes, finned structures, pins and a variety of other complicated structures formed above a semiconductor substrate.

FIG. 2, in contrast to the stacked capacitors of FIGS. 1A and 1B, illustrates a memory cell 30 incorporating an exemplary trench capacitor 31, formed largely within a semiconductor substrate 32. As with the stacked capacitors of the previous figures, a transistor includes a gate stack 34 over the substrate 32 and heavily doped active areas 36 within the substrate 32. The drain region (one of the active areas 36) electrically contacts a lower or storage electrode 42 of the capacitor 31. Doping or otherwise making conductive the walls of a trench in the semiconductor substrate 32 forms this lower 42. By conforming to the walls of the trench, a larger surface area is provided for the lower electrode 42, relative to the footprint of the substrate 32 in which it is formed. A thin capacitor dielectric layer 44 coats the bottom electrode 42, and a top or reference electrode 46 is formed over the capacitor dielectric 44.

Relying solely on such structures for increasing the capacitance of the memory cell, however, becomes impractical with advancing generations of memory chip circuit designs. The surface area of a stud capacitor can theoretically be increased infinitely simply by increasing the height of the bottom electrode. Similarly, the depth of trench capacitors can be increased almost to the thickness of the substrate within which it is formed. Unfortunately, limits are imposed upon the height or depth of features in integrated circuits. As is well known in the art, it can be difficult to conformally coat, line or fill features with high steps using conventional deposition techniques. Additionally, increased topography on a chip can adversely affect the resolution of later photolithographic processes.

Rather than relying solely upon the height or depth of the cell capacitor, therefore, a microstructure can be added to further increase the surface area of the capacitor electrodes, by providing a textured or roughened surface to the macrostructural folds of the lower electrode. For example, polycrystalline conductive materials can be roughened by preferentially etching along grain boundaries, as disclosed, for example, in U.S. Pat. No. 3,405,801, issued to Han et al. Alternatively, U.S. Pat. No. 5,372,962, issued to Hirota et al., describes various selective etch processes for perforating a polysilicon layer.

Another class of electrode texturing techniques involve formation of hemispherical grained (HSG) silicon. Several methods for forming HSG silicon are known, including direct deposition, whereby deposited polysilicon selectively grows over nucleation sites, and redistribution anneal of amorphous silicon, whereby thermal energy causes silicon atoms to migrate about a surface and conglomerate about nucleation sites. FIGS. 1A and 1B show the lower electrodes 22, 22a including HSG silicon microstructures 28, 28a formed over the basic stud or cylinder configurations, thereby increasing the effective electrode surface area. Similarly, the bottom electrode 42 of FIG. 2 includes an HSG silicon layer 48 over the basic trench configuration, further increasing the electrode surface area.

In order to fully realize the advantage of the increased surface area of textured bottom electrodes, the capacitor dielectric layer should conform closely to the surface of the bottom electrode. While the dielectric thickness ("d" of the capacitance formula set forth above) should be minimized in order to maximize capacitance, too thin a capacitor dielectric risks leakage current across the capacitor electrodes. Leakage current may result from pinholes in the dielectric and quantum tunneling effects, both of which phenomena are more likely to occur with thinner dielectrics. Thin capacitor dielectric layers are thus characterized by a low breakdown voltage, limiting the charge that may be stored on the bottom electrode before breakdown leakage occurs. Accordingly, capacitor dielectric layers may be characterized by a certain minimal thickness necessary to avoid breakdown, depending upon the selected dielectric material.

Referring to FIG. 3, an enlarged view of an HSG silicon layer 50 is illustrated. The layer 50 comprises hemispherical grains 52 of conductively doped polycrystalline silicon (polysilicon, or simply poly) over a conductive substrate 54. The grains 52 have grain sizes ranging from about 50 Å to about 750 Å. A dielectric layer 56, deposited by CVD, is shown over the HSG layer 50. The illustrated dielectric comprises conventional dielectric materials, such as silicon oxide ($SiO_2$) and/or silicon nitride ($Si_3N_4$), which are well-understood and easily integrated with conventional fabrication process flows. CVD processes for these materials, for example, are well developed.

As shown, the dielectric layer 56 deposited by CVD is relatively conformal over the surfaces of the HSG silicon layer 50. However, conventional CVD processes cannot produce perfectly conformal dielectrics over high surface area textures, such as HSG silicon, due to a variety of factors. CVD inherently results in disparate deposition rates at different points of the topography across the workpiece. Non-uniformities in temperature across a workpiece, particularly across large workpieces like 300-mm wafers, can strongly influence thickness uniformity of a CVD layer. Variations in reactant concentration, due to reactor design, gas flow dynamics and the depletion effect, similarly affect the thickness uniformity across large workpieces. Due to these and other problems, growth rates and conformality cannot be controlled with absolute precision using conventional CVD.

Independently of variations across the workpiece, non-uniformity also results on a microlevel over rugged surfaces. In particular, at the neck region 60 between adjacent grains 52 that approach or intersect with one another, the dielectric layer bridges the adjacent grains 52 and produces an effectively greater dielectric thickness than over the top surfaces 61 of the grains. In some cases, reentrant profiles 62 are produced between blossoming or mushroom-shaped grains 52. CVD of a dielectric over the neck regions 60 of such structures results in either completely filling the neck region between grains 52 or leaving voids 64 between the grains 52 while the dielectric pinches off. In either case, the top electrode cannot conform to the surfaces of the grains 52, such that the lower portions of the grains 52 are effectively lost and do not contribute to capacitance.

If the dielectric 56 is deposited to the minimal thickness in neck regions 60 between HSG silicon grains, the dielectric over the top surfaces is too thin and can lead to leakage and consequent data errors. Accordingly, the dielectric 56 must be deposited to the minimal thickness required to avoid leakage over top surfaces 61 of the grains 52. The dielectric 56 at the neck regions 60 the grains 52 is thus thicker than theoretically necessary, leading to reduced capacitance. From another perspective, dielectric bridging across the neck regions 60 results in effective loss of surface area from lower portions of the HSG grains 52, such that the full advantage of HSG silicon is not realized.

Due in part to such limitations on capacitance enhancement by increasing electrode surface area, more recent attention has been focused instead upon methods of increasing the dielectric constant (k) of the capacitor dielectric. Much effort has been aimed at integrating new dielectric materials having higher k values. High k materials include aluminum oxide ($Al_2O_3$), tantalum oxide ($Ta_2O_5$), barium strontium titanate (BST), strontium titanate (ST), barium titanate (BT), lead zirconium titanate (PZT), and strontium bismuth tantalate (SBT). These materials are characterized by effective dielectric constants significantly higher than conventional dielectrics (e.g., silicon oxides and nitrides). Whereas k equals 3.9 for silicon dioxide, the dielectric constants of these new materials can range from on the order of 10 (aluminum oxide) to 300 (BST), and some even higher (600 to 800). Using such materials enables much greater increases in cell capacitance/footprint.

Moreover, dramatic increases in k value for the capacitor dielectric allow use of smaller and simpler capacitor designs for a given stored charge requirement. Reducing the surface area needs for a cell capacitor can simplify the integration process and allow greater packing densities for future circuit designs.

Integrating high k materials into conventional process flows, however, has proven challenging. Some materials, such as $Ta_2O_5$, BST and other "exotic" materials, tend to involve highly oxidizing, high temperature deposition and post-deposition anneal conditions, leading to oxidation of traditional electrode materials and even diffusion of oxygen into lower circuit elements. Other materials, such as $ZrO_2$ and $TiO_2$, have highly inconsistent properties, depending upon a variety of processing conditions.

Accordingly, a need exists for more effective methods of increasing the storage capacitance for integrated memory cells.

SUMMARY OF THE INVENTION

In satisfaction of this need, methods are provided herein for depositing dielectric and top electrode materials over textured bottom electrode surfaces. Advantageously, the methods attain high conformality, such that only the minimum required thickness of the lining layer need be formed on all surfaces. The methods enable deposition of high dielectric constant (high k) materials over hemispherical grain (HSG) silicon under conditions favorable to maintaining silicon electrodes.

In general, the methods comprise cycles of alternating reactant phases, wherein each phase has a self-limiting effect. Metal oxides and ternary materials having dielectric constants of greater than about 10 can be formed by alternately adsorbing self-terminated metal or silicon complex monolayers through ligand-exchange reactions. The ligands present on the adsorbed metal or silicon complex are then removed by presence of an oxygen-containing species, leaving OH groups and oxygen bridges for halide or organic monolayers. Examples are provided herein for simple binary metal oxides, ternary materials such as metal silicates and nanolaminates comprising alternating ultrathin dielectric layers of different compositions.

Advantageously, the methods enable forming uniformly thick dielectric layers over HSG silicon, desirably as thin as possible without inducing leakage current through the capacitor dielectric so formed. Moreover, the methods facilitate a combination of high k materials with high surface area, textured electrodes. Capacitance is thus maximized, facilitating further scaling of critical dimensions without loss of cell reliability.

Similar alternating chemistries are preferably employed to form top electrode materials over the conformal dielectric layers. Examples are provided herein for metal nitride barriers as well as elemental metal layers. Following formation of thin, conformal conductive layer(s) by the preferred methods, conventional deposition with reduced conformability can complete the desired thickness of the top electrode without sacrificing capacitance. Conformal capacitor dielectric and top electrodes formed by the preferred methods thus enable taking full advantage of the increased surface area afforded by textured bottom electrodes.

BRIEF DESCRIPTION OF THE DRAWINGS

These and other aspects of the invention will be readily apparent to the skilled artisan in view of the description below, the appended claims, and from the drawings, which are intended to illustrate and not to limit the invention, and wherein:

DETAILED DESCRIPTION OF THE PREFERRED EMBODIMENT

Figure 1A:
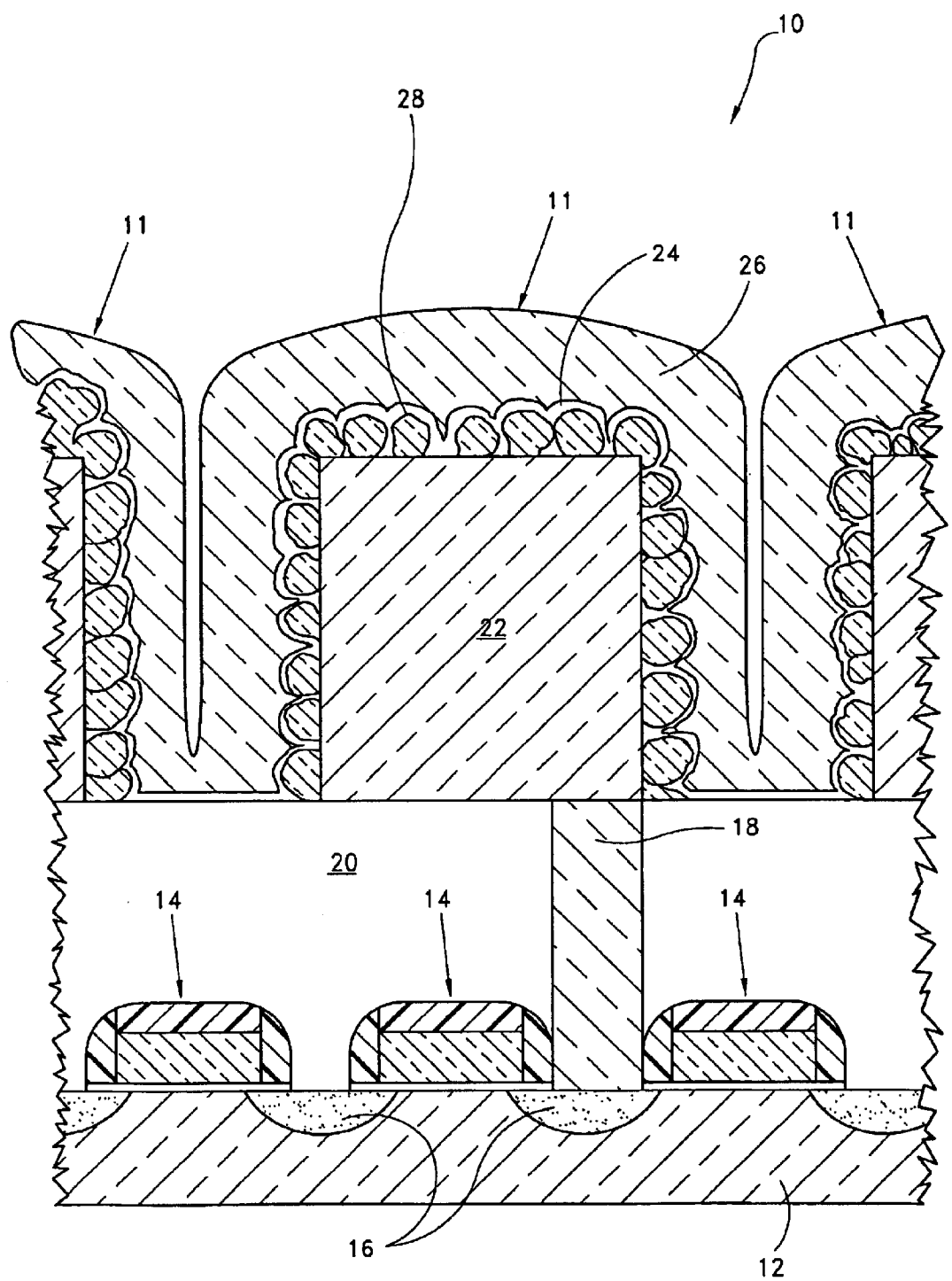
FIG. 1A is a schematic cross-section of an integrated stacked (stud) capacitor memory cell incorporating hemispherical grain (HSG) silicon.

Though described in the context of certain preferred materials, it will be understood, in view of the disclosure herein, that the described methods and structures will have application to a variety of other materials suitable for capacitor dielectrics over rugged surfaces. Moreover, while illustrated for memory cell storage capacitors, the skilled artisan will readily appreciate application of the described methods to other roughened electrodes, such as the floating gate electrode of an Electrically Erasable Programmable Read Only Memory (EEPROM) device.

As discussed in the Background section above, coating capacitor electrodes, and particularly electrode structures bearing hemispherical grain (HSG) silicon, by conventional chemical vapor deposition (CVD) produces less than perfect conformality. While much research has been devoted to obtaining more conformal step coverage of semiconductor stepped features in general, it is very difficult to supply the same concentration of depositing species to all surfaces of such structures. In particular, it is difficult to supply the same concentration of depositing species at the upper surfaces of HSG grains as supplied to neck regions between grains. This problem is particularly exacerbated where the textured electrode conforms to a three-dimensional folding structure, such as the stacked and trench designs of FIGS. 1A to 2, and even more so for structures with interior volumes like that of FIG. 1B. Accordingly, full advantage of the increased surface area of the HSG silicon is not realized.

By providing almost perfect step coverage, the preferred embodiments advantageously obtain the minimum necessary thickness for the desired capacitor dielectric layers over all surfaces of HSG grains. Desirably, the methods of the preferred embodiment are less dependent upon the relative concentration of reactant species over grains as compared to confined grain intersections.

Moreover, the preferred embodiments provide methods of depositing high k materials in a manner that enables integration with high-surface area textured surfaces and with silicon electrodes, which is most often employed to produce microstructural roughness such as an HSG morphology. Rather than presenting a choice between high surface area textures over three-dimensional folding structures and high k dielectrics, the preferred embodiments allow the use of both techniques to achieve very high capacitance/footprint in a repeatable, production-worthy process.

The preferred embodiments provide exemplary processes for depositing $Al_2O_3$ ($k\approx10$), $ZrO_2$ ($k\approx12-20$), $TiO_2$ ($k\approx20-50$), mixed zirconium silicon oxide ($k\approx8-13$), and nanolaminate dielectrics formed by combinations of the above. Similarly, methods are provided for depositing electrode materials over the dielectric and HSG silicon. These materials are all formed by methods compatible with HSG silicon, furthermore producing almost perfect conformality. Thus, the preferred embodiments allow increased capacitance not only due to the high k dielectric materials, but also due to taking full advantage of the increased surface area afforded by HSG silicon. Such conformality obtains even over high aspect ratio structures like stacked and trench capacitor designs.

Further advantages of the preferred processes will be apparent from the discussion below.

Methods of Forming Conformal Capacitor Dielectrics

Figure 4A:
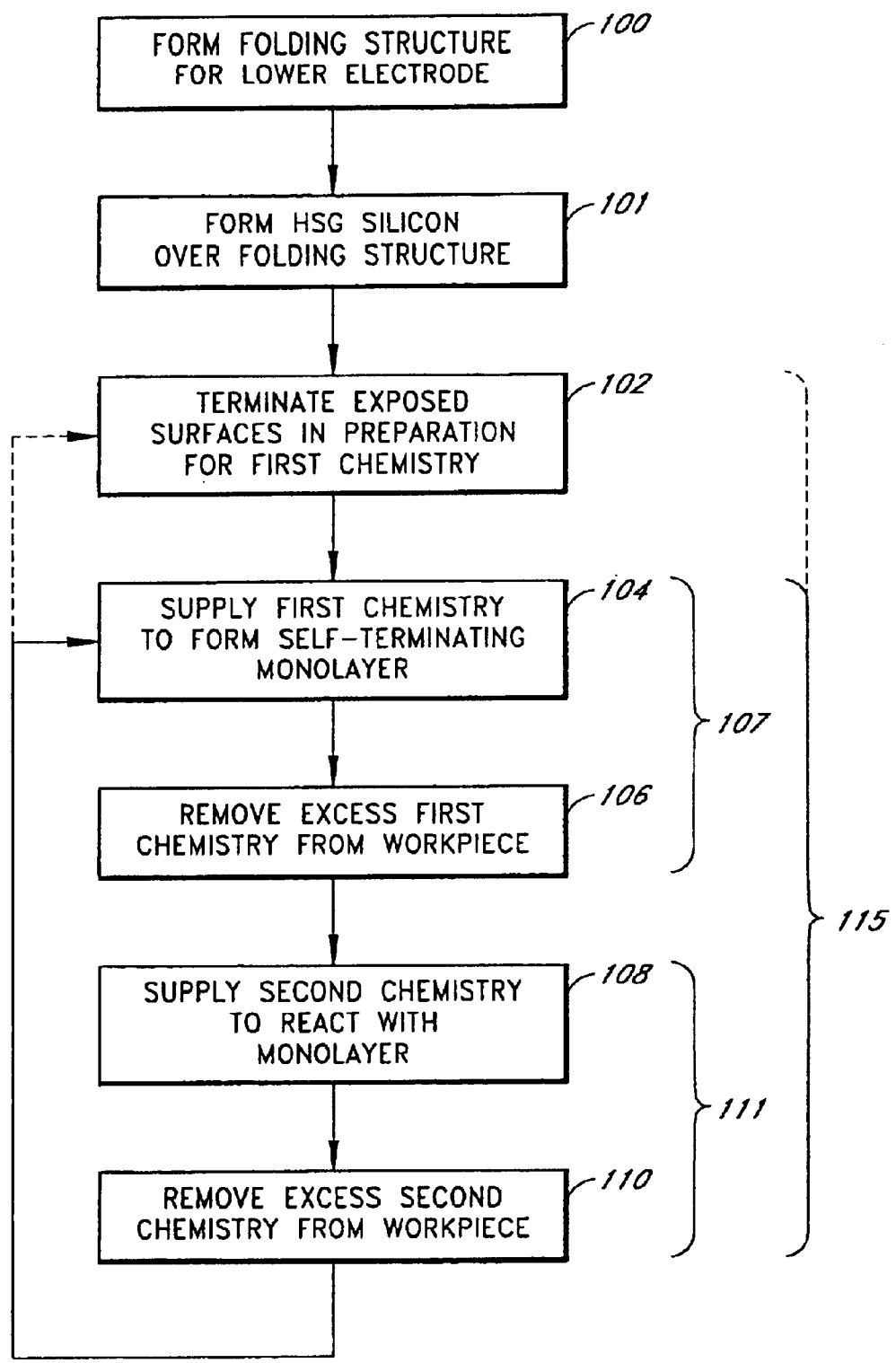
FIG. 4A is a flow chart generally illustrating a method of forming memory cells with conformal dielectric layers over HSG silicon.

FIG. 4A generally illustrates a method of forming capacitor dielectric layers with high step coverage. The preferred method is a form of atomic layer deposition (ALD), whereby reactants are supplied to the workpiece in alternating pulses in a cycle. Preferably, each cycle forms no more than about one monolayer of material by adsorption and more preferably by chemisorption. The substrate temperature is kept within a window facilitating chemisorption. In particular, the substrate temperature is maintained at a temperature low enough to maintain intact bonds between adsorbed complex and the underlying surface, and to prevent decomposition of the precursors. On the other hand, the substrate temperature is maintained at a high enough level to avoid condensation of reactants and to provide the activation energy for the desired surface reactions in each phase. Of course, the appropriate temperature window for any given ALD reaction will depend upon the surface termination and reactant species involved.

Each pulse or phase of each cycle is preferably self-limiting in effect. In the examples set forth below, each of the phases are self-terminating (i.e., an adsorbed and preferably chemisorbed monolayer is left with a surface non-reactive with the chemistry of that phase). An excess of reactant precursors is supplied in each phase to saturate the structure surfaces. Surface saturation ensures reactant occupation of all available reactive sites (subject to physical size restraints, as discussed in more detail below), while self-termination prevents excess film growth at locations subject to longer exposure to the reactants. Systematic utilization of saturation through chemisorption, i.e., self-terminating chemistries, ensure excellent step coverage.

Prior to forming the dielectric layer, an integrated circuit is first partially fabricated to the point of constructing a capacitor lower or bottom electrode. Typically, the bottom electrode serves as a storage electrode in the memory cell. For purposes of the present description, however, the bottom electrode represents the first-formed capacitor electrode or plate, regardless of whether it serves as the storage or reference plate in the completed integrated circuit.

Figure 1B:
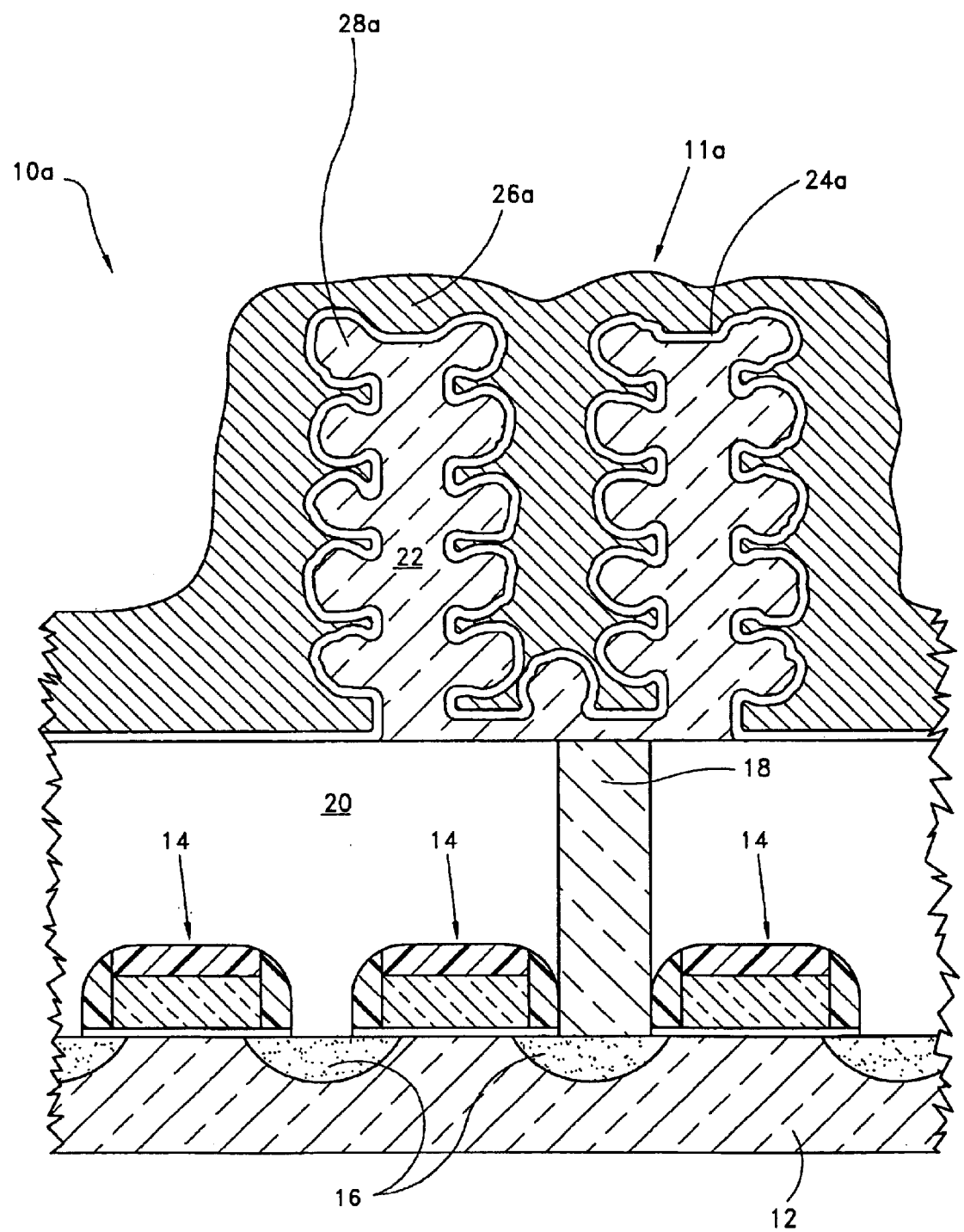
FIG. 1B is a schematic cross-section of another integrated stacked (cylindrical) capacitor memory cell incorporating HSG silicon.
Figure 2:
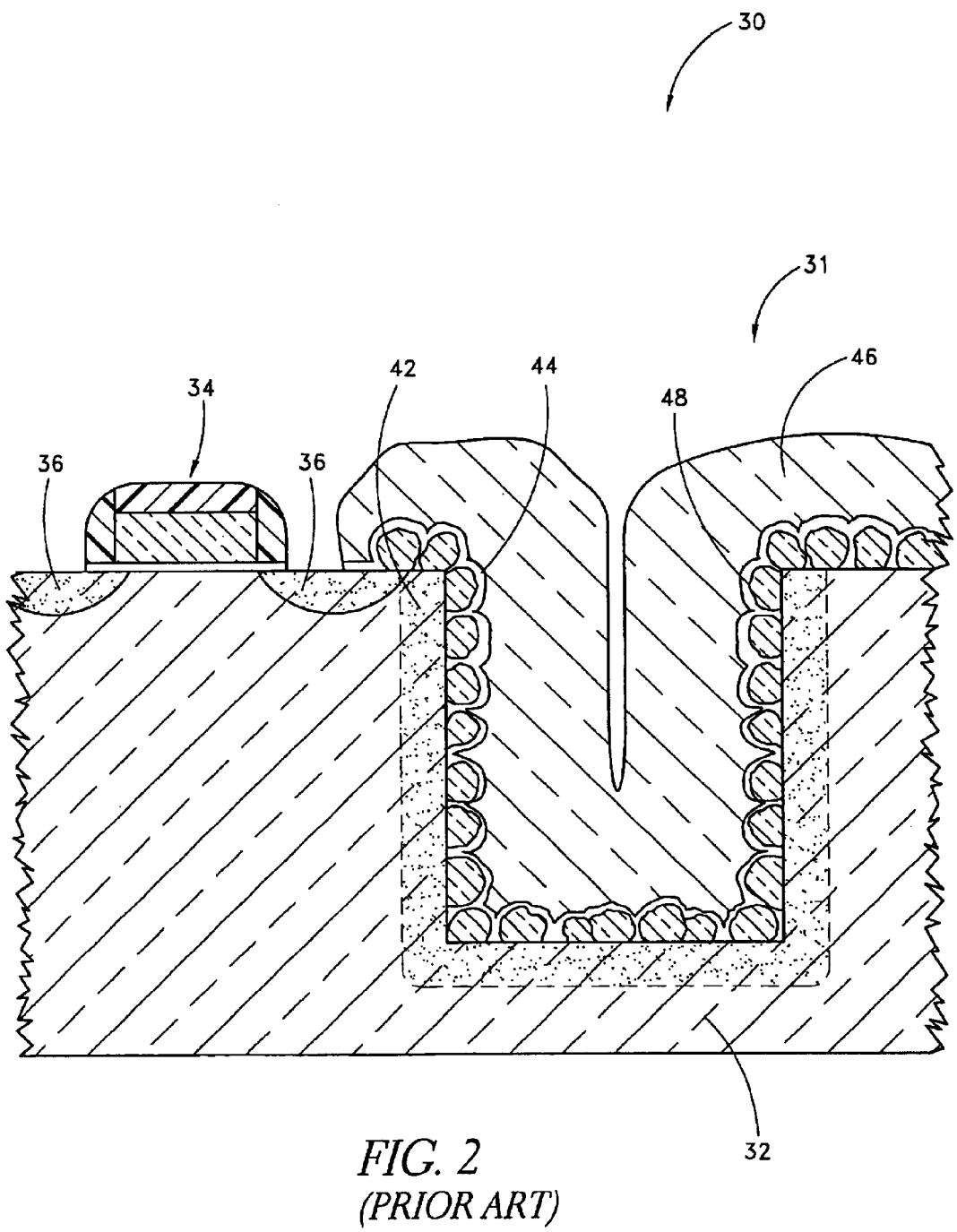
FIG. 2 is a schematic cross-section of an integrated trench capacitor memory cell incorporating HSG silicon.
Figure 3:
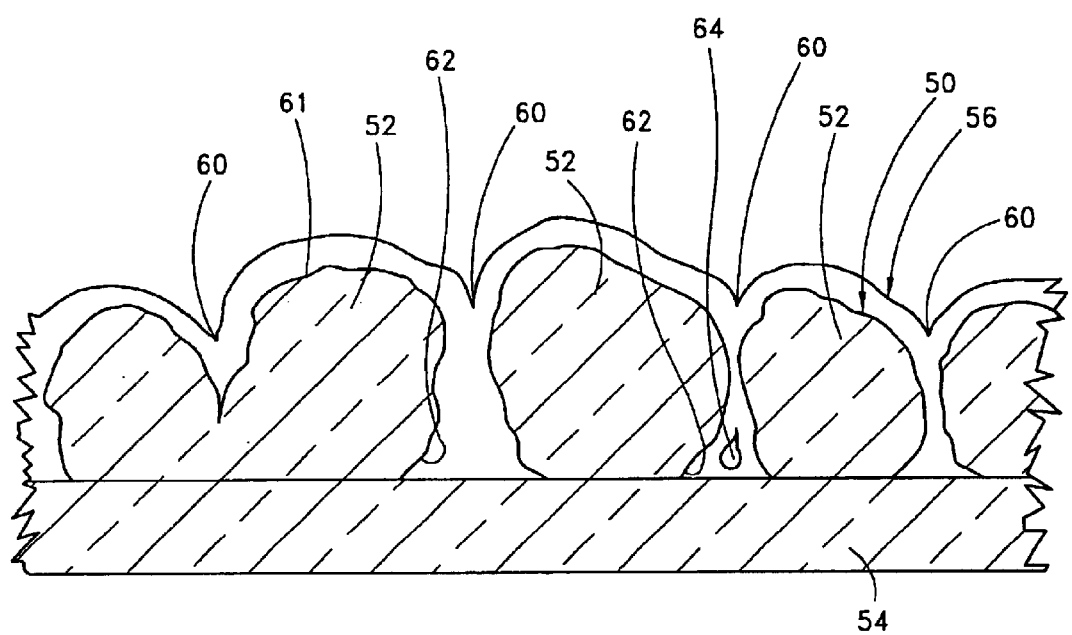
FIG. 3 is an enlarged view of a portion of a capacitor incorporating HSG with a dielectric formed by conventional chemical vapor deposition (CVD)

As illustrated in FIG. 4A, the process in accordance with preferred binary material embodiments begins with formation 100 of a bottom electrode structure in an integrated circuit. The basic bottom electrode structure can be planar, such as the floating gate in an EEPROM device. Preferably, however, the bottom electrode conforms to a three-dimensional folding structure having a greater surface area than the substrate footprint occupied by the memory cell. More preferably, the capacitor bottom electrode takes the form of a stacked capacitor, such as the stud configuration illustrated in FIG. 1A or the cylindrical configuration illustrated in FIG. 1B. The skilled artisan will readily appreciate that the methods disclosed herein are also applicable to other stacked capacitor designs, such as crowns, finned structures, combs, pins, etc. In another arrangement, the capacitor bottom electrode is formed by conductively doping and/or conductively lining the walls of a trench formed within a semiconductor substrate, as illustrated in FIG. 2.

After formation of the bottom electrode macrostructure, in either a stacked or trench arrangement, the bottom electrode is then provided 101 with a textured or roughened microstructure superimposed upon the three dimensional folding shape, further enhancing the surface area of the bottom electrode, preferably in the form of a layer of HSG silicon.

In an exemplary fabrication, conducted in a batch system sold under the trade name A600 UHV™ by ASM, International, Inc, the HSG silicon is formed by amorphous silicon deposition, seeding and redistribution anneal. A three-dimensional folding structure is formed of or coated with amorphous silicon. While in some processes, the amorphous silicon deposition can be conducted in situ within the same reaction chamber as the subsequent steps, in the illustrated embodiment, the folding amorphous silicon structure is formed prior transferring wafers to the A600 UHV™ system.

Within the preferred reactor, the amorphous silicon surface is seeded. In the illustrated embodiment, the temperature is raised to a level within the range of about 550° C. to 575° C. (e.g., about 560° C.) while the reactor pressure is preferably reduced to on the order of about $10^{-5}$ Torr. A seeding gas in the preferred embodiment is monosilane, provided with a silane partial pressure of about $4 \times 10^{-6}$ Torr. After seeding, the density of which can be varied according to design, continued thermal treatment at the desired temperature results in a redistribution of mobile amorphous silicon. Silicon atoms tend to agglomerate about the seed or nucleation sites formed by the silane. The entire process takes on the order of about 10 minutes and 120 minutes for the batch system, including temperature ramp, seeding and anneal. The skilled artisan will readily appreciate numerous other techniques for forming HSG silicon.

The HSG grains produced by the preferred process can range in size from about 50 Å to 750 Å, with more a typical range of about 300 Å to 500 Å. The process conditions affecting nucleation density and HSG silicon grain size are typically selected to leave grains largely separated from one another. Such an arrangement maximizes electrode surface area within the constraint of allowing most of the subsequent dielectric and top electrode layers to fit between the grains. As will be appreciated from the enlarged views of FIGS. 7 through 10, however, the grains randomly converge at some locations due to the inherently random seeding process. Moreover, the preferred dielectric and top electrode layers enable use of denser, less separated grains, thus increasing the usable surface area.

As will be appreciated by the skilled artisan, the bottom electrode preferably serves as the storage node of a memory cell in a dynamic random access memory (DRAM) array. After fabrication, the bottom electrode is typically isolated from the bottom electrodes of other cells across the array, as shown in FIGS. 1A, 1B and 2.

The bottom electrode structure so formed is thereafter coated with high step coverage. In accordance with the preferred embodiments, the dielectric layer is formed by a periodic process in which each cycle forms no more than about one monolayer of dielectric material upon the workpiece in a self-limiting manner. Preferably, each cycle comprises at least two distinct phases, wherein each phase is a saturative reaction, i.e., self-limitingly, leaving no more than about one atomic monolayer of the desired dielectric material.

If necessary, the exposed surfaces of the bottom electrode (e.g., the HSG silicon of the preferred embodiments) are terminated 102 to react with the first phase of the ALD process. The first phases of the preferred metal oxide embodiments (see Tables I to V) are reactive, for example, with hydroxyl (OH) or ammonia ($NH_3$) termination. In the examples discussed below, silicon surfaces of HSG silicon will not generally require a separate termination. Exposure to a clean room environment results in native oxide formation that naturally provides OH termination 102. Where HSG is formed in situ or in a cluster tool prior to dielectric formation, it may be desirable to expose the HSG to $H_2O$ vapor, for example, as a surface preparation or termination 102 treatment. In other arrangements (see the discussion of Tables II and III below and FIG. 8), metal oxides can also be formed directly on silicon nitride without a separate termination step. In other words, nitridation of HSG silicon can serve as the termination 102.

After initial surface termination 102, if necessary, a first chemistry is then supplied 104 to the workpiece. In accordance with the preferred metal oxide embodiments, discussed in more detail below with respect to FIG. 5, the first chemistry comprises a metal-containing compound that is reactive with the terminated surfaces left by the previous step 102. Accordingly, a metal complex replaces the surface termination by means of ligand exchange. The resultant metal-containing monolayer is desirably self-terminating, such that any excess constituents of the first chemistry do not further react with the monolayer formed by this process. Preferably a halide or organic ligand terminates the metal-containing monolayer.

The metal-containing reactive species is preferably supplied in gaseous form, and is accordingly referred to hereinbelow as a metal source gas. The first chemistry is then removed 106 from the reaction chamber. In the illustrated embodiments, step 106 merely entails stopping the flow of the first chemistry while continuing to flow a carrier gas for a sufficient time to diffuse or purge excess reactants and reactant by-products out of the reaction chamber, preferably with greater than about two reaction chamber volumes of the purge gas, more preferably with greater than about three chamber volumes. In the illustrated embodiment, the removal 106 comprises continuing to flow purge gas for between about 0.1 seconds and 20 seconds after stopping the flow of the first chemistry. Inter-pulse purging is described in co-pending U.S. patent application having Ser. No. 09/392,371, filed Sep. 8, 1999 and entitled IMPROVED APPARATUS AND METHOD FOR GROWTH OF A THIN FILM, the disclosure of which is incorporated herein by reference. In other arrangements, the chamber may be completely evacuated between alternating chemistries. See, for example, PCT publication number WO 96/17107, published Jun. 6, 1996, entitled METHOD AND APPARATUS FOR GROWING THIN FILMS, the disclosure of which is incorporated herein by reference. Together, the adsorption 104 and removal 106 of excess reactant and by-products represent a first phase in an ALD cycle.

When the unreacted (or excess) reactants of the first chemistry have been removed 106 from the chamber, a second chemistry is supplied 108 to the workpiece. The second chemistry desirably reacts with the self-terminated monolayer formed in step 104. In the illustrated metal oxide embodiments, described in more detail below with respect to FIG. 5, this reaction comprises supplying an oxygen source gas to the workpiece. Oxygen or an oxygen-containing complex from the oxygen source gas preferably reacts with upon the previously adsorbed metal complex to leave a metal oxide monolayer in place of the metal complex monolayer.

In other arrangements, the second chemistry may simply remove the ligand termination of the adsorbed metal complex monolayer formed in step 104 (e.g., by sublimation or reduction) or otherwise prepare the monolayer for oxidation or chemisorption of a further chemistry.

Desirably, the reaction 108 is also self-limiting. Reactants saturate the limited number of reaction sites left by step 104. Temperature and pressure conditions are preferably arranged to avoid diffusion of reactants from the second chemistry through the monolayer to underlying materials. The second chemistry also leaves a surface termination that is not reactive with excess reactants in the second chemistry, thus operating to limit the deposition in a saturative reaction phase. In the illustrated embodiments of Tables I to V below, hydroxyl (OH) tails and oxygen bridge termination on a metal oxide monolayer are non-reactive with excess oxygen source gases of the second chemistry.

After a time period sufficient to completely saturate the surface of the metal-complex monolayer through chemisorption (or self-limiting reaction) of the second chemistry, the excess second chemistry is removed 110 from the workpiece. As with the removal 106 of the first chemistry, this step 110 preferably comprises stopping the flow of the second chemistry and continuing to flow carrier gas for a time period sufficient to purge excess reactants and reaction by-products of the second chemistry from the reaction chamber. For example, reactants and reaction by-products can be removed by flowing purge gas after stopping the flow of the first chemistry, preferably with at least about two chamber volumes of purge gas and more preferably with at least about three chamber volumes. In the illustrated embodiment, the removal 110 comprises continuing to flow purge gas for between about 0.1 seconds and 20 seconds after stopping the flow of the first chemistry. Together, the reaction 108 and removal 110 represent a second phase 111 in an ALD cycle.

In the illustrated embodiment, where two phases are alternated once the excess reactants and by-products of the second chemistry have been purged from the reaction chamber, the first phase of the ALD process is repeated. Accordingly, supplying 104 the first chemistry again to the workpiece forms another self-terminating monolayer.

The two phases 107, 111 thus represent a cycle 115 repeated to form monolayers in an ALD process. The first chemistry generally reacts (in a ligand-exchange) with or chemisorbs upon the termination left by the second chemistry in the previous cycle. If necessary, the cycle 115 can be extended to include a distinct surface preparation, similar to step 102, as shown in dotted lines in FIG. 4. The cycle 115 then continues through steps 104 to 110. This cycle 115 is repeated a sufficient number of times to produce a dielectric layer over the HSG silicon of a thickness sufficient to avoid current leakage during circuit operation. Alternatively, a thinner layer can be followed by further dielectric layers, deposited by a similar ALD process, to form a stack of dielectric sublayers, as will be better understood from the discussion of FIG. 9 below.

Figure 4B:
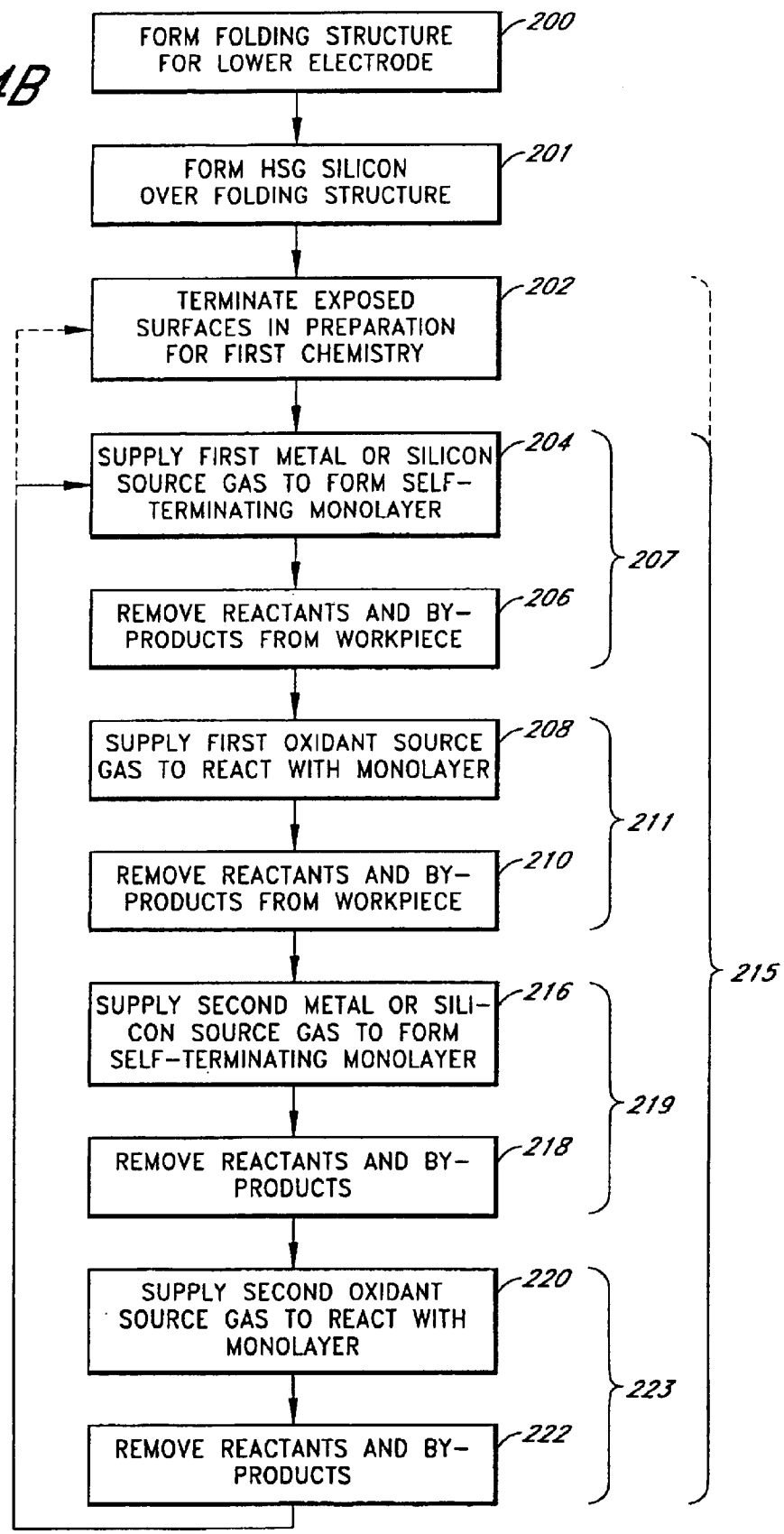
FIG. 4B is a flow chart more particularly illustrating a method of forming memory cells with conformal ternary dielectric materials over HSG silicon.

With reference to FIG. 4B, additional chemistries can also be included in each cycle. In FIG. 4B, steps corresponding to those of FIG. 4A are referenced by numerals with the same last two digits in a 200 series, rather than the 100 series of FIG. 4A. Accordingly, steps 200–210 are similar to corresponding steps 100–110 of FIG. 4A.

The illustrated cycle 215 of FIG. 4B, however, extends to include two additional phases. The first phase 207 and second phase 211 form a self-terminated metal oxide or silicon oxide monolayer. A third phase 219 and fourth phase 223 form another self-terminated metal oxide or silicon oxide monolayer. Note that the composition of the second monolayer preferably differs from the composition of the first monolayer at the discretion of the recipe designer. See, e.g. the metal silicate example of Table VI below.

In particular, after a first metal/silicon phase 207 and first oxygen phase 211 form a first metal oxide or silicon oxide monolayer, a second metal or silicon source gas is supplied 216 to form a self-limiting or self-terminating metal or silicon complex monolayer over the previously formed metal/silicon oxide. Similar to the first metal/silicon phase 207, the metal/silicon gas source can react by ligand-exchange (chemisorption) upon the previously formed metal/silicon oxide. Following another removal 218 (by evacuation or preferably by purging) of the reactants, a second oxygen gas source is supplied 220 and then removed 222. The second oxygen step 220 (or oxygen phase 223) is also self-limiting. As with the first oxygen step 208, the oxygen gas source can react by ligand-exchange (chemisorption).

Though the illustrated process includes four phases in each cycle 215, the cycle 215 will be referred to herein as a "ternary cycle 215," since it produces a ternary dielectric. This is due to the fact that the second phase 211 and fourth phase 223 both contribute the same element (oxygen) to the growing dielectric layer. Note that, in other arrangement, depending upon the desired oxygen content in the dielectric layer, either the second phase or the fourth phase can be omitted. In such a case, consecutive chemistries would be selected to effect ligand-exchange reactions to produce surface termination with small enough ligands to permit some diffusion of a subsequent chemistry, and/or to have intermediate reduction phases in place of the omitted oxygen phase.

The second metal/silicon source gas in the third phase 219 can be a metal halide or metallorganic precursor, producing a metal complex monolayer self-terminated with halide or organic ligands that are non-reactive with the second metal/silicon source gas. In the example of Table VI, however, the second metal/silicon source gas comprises a silicon source gas conducive to self-limiting chemisorption, such as 3-aminopropyltriethoxysilane ($NH_2CH_2CH_2CH_2$—$Si(O$—$CH_2CH_3)_3$ or AMTES) or 3-aminopropyltrimethoxsilane ($NH_2CH_2CH_2CH_2$—$Si(O$—$CH_3)_3$ or AMTMS) compound, or a halosilane. Note that the sequence of the metal source and silicon source phases can be reversed.

The oxygen source gas of the fourth phase 220 can be the same or differ from that of the second phase 211. The inventors have found certain oxidants (e.g., ozone) to be advantageous for oxidizing metal or silicon complex monolayers having organic ligands, whereas other oxidants (e.g., water) are more advantageous for halide-terminated metal or silicon complex monolayers. Accordingly, in the example of Table VI below, the oxidant of the fourth phase 223 differs from the oxidant of the third phase 219, at least for those cycles in which the metal/silicon source of the third phase 219 differs from the metal/silicon source of the first phase 207.

For a roughly one-to-one ratio of the different metals or metal:silicon in the resultant dielectric, the cycle 215 is repeated, as shown. In the example of Table VI below, for example, repeated cycles with metal, oxygen, silicon and oxygen phases, in sequence, produces a metal silicate layer. Alternatively, the illustrated cycle 215 for a ternary dielectric can be conducted after a string of binary cycles 115 (FIG. 4A), depending upon the desired ratio of the different metals in the resultant ternary dielectric. Conversely, a binary cycle 115 (FIG. 4A) can be conducted after a string of ternary cycles 215. Software controlling the gas flow valves can be programmed, for example, to conduct a one ternary cycle 215 after every three binary cycles 115 (FIG. 4A). Such a process would produce roughly a 3:1 ratio of a first metal to a second metal (or silicon) in the dielectric layer. The skilled artisan will appreciate, in view of the disclosure herein, that the actual ratio would depend both upon the frequency with which the second metal is substituted in the process and upon the relative physical size of the chemisorbed molecules.

Though both the binary and ternary processes are illustrated in FIGS. 4A and 4B with an initial metal/silicon phase and a subsequent oxygen phase in the examples below, it will be understood that the cycles can begin with an oxygen phase, depending upon the lower surfaces and phase chemistries.

Methods of Forming Metal Oxide Dielectrics

Figure 5:
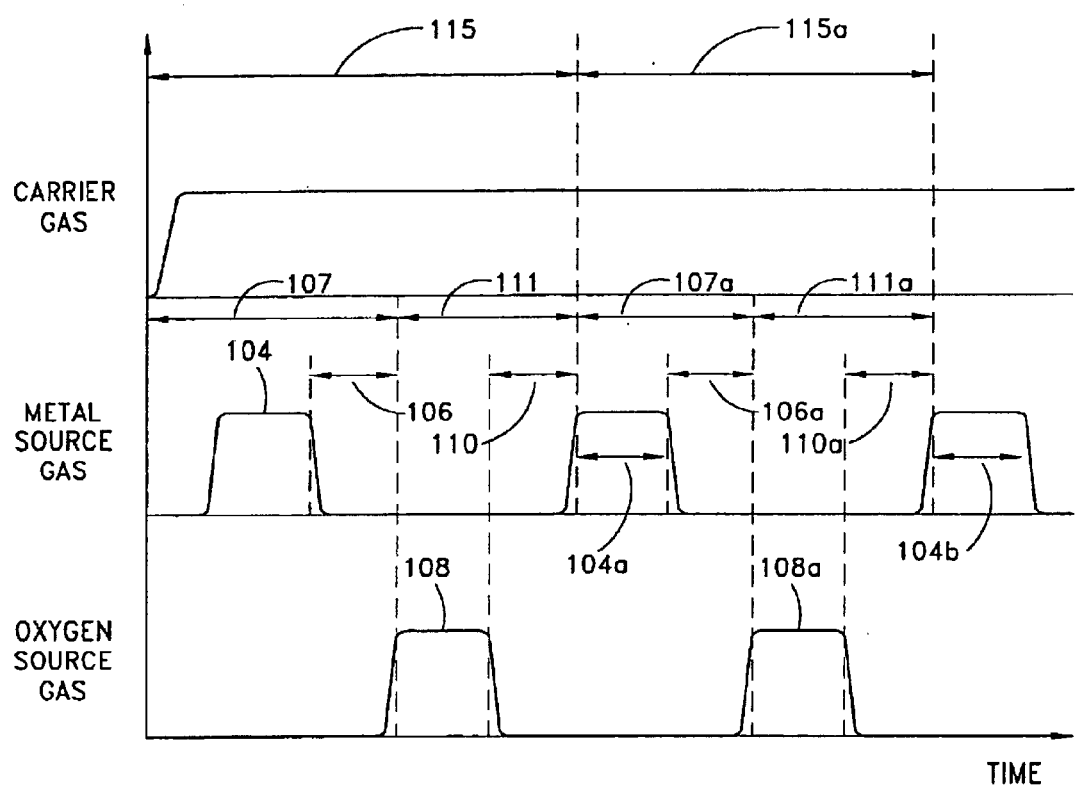
FIG. 5 is an exemplary gas flow diagram for depositing binary dielectric layers, in accordance with preferred embodiments of the present invention.

FIG. 5 and Tables I to V below illustrate exemplary processes for forming metal oxide dielectrics over the HSG silicon of the bottom electrode. Table I exemplifies forming an oxide of a non-transition metal (e.g., aluminum); Tables II and III exemplify forming an oxide of a Group V transition metal (e.g., vanadium, niobium, tantalum); and Tables IV and V exemplify forming an oxide of Group IV transition metals (e.g., titanium, zirconium, hafnium). For simplicity, like reference numerals are employed to refer to the phases and steps of the metal oxide examples (FIG. 5) that correspond to the general description of FIG. 4A.

With reference now to FIG. 5, a gas flow sequence is represented in accordance with a particular embodiment. In the illustrated example, a high k dielectric, and more particularly a high k metal oxide, is formed by supplying the workpiece with a metal source gas alternately with an oxygen source gas. The first or metal phase 107 of each cycle chemisorbs a layer of metal-containing material, desirably in the absence of the oxygen source gas. The second or oxygen phase 111 of each cycle reacts or adsorbs an oxygen-containing material on the deposited metal-containing layer, desirably in the absence of the metal source gas. It will be understood that, in other arrangements, the order of the phases can be reversed, and that the reactant removal or purge steps can be considered part of the preceding or subsequent reactant pulse.

Surfaces upon which the dielectric material is to be formed are initially terminated to provide a surface that is reactive with the metal source gas. In the preferred embodiments, the exposed surfaces upon which deposition is desired include HSG silicon with OH terminating tails (see FIG. 7) and silicon nitride (see FIG. 8).

Most preferably, the metal phase 107 is self-limiting, such that no more than about one atomic monolayer is deposited during the first phase. Desirably, a volatile metal source gas is provided in a pulse 104. Exemplary metal source gases include: trimethyl aluminum (TMA or $(CH_3)_3Al$); aluminum chloride ($AlCl_3$); aluminum betadiketonates (e.g., $Al(acac)_3$); tantalum ethoxide ($Ta(OCH_2CH_3)_5$); tantalum pentachloride ($TaCl_5$); pentakis(dimethylamino) tantalum ($Ta[N(CH_3)]_5$); zirconium tetrachloride ($ZrCl_4$); zirconium butoxide ($ZrOCH_2CH_2CH_3)_4$); titanium tetrachloride ($TiCl_4$); titanium isopropoxide ($Ti[OCH(CH_3)_3]_4$); tetrakis (dimethylamino) titanium ($Ti[N(CH_3)_2]_4$); tetrakis (dimethylamino) titanium ($Ti[N(CH_5)_2]_4$ tungsten hexafluoride ($WF_6$); 3-aminopropyltriethoxysilane ($NH_2CH_2CH_2CH_2$—$Si(O$—$CH_2CH_3)_3$ or AMTES); 3-aminopropyltrimethoxsilane ($NH_2CH_2CH_2CH_2$—$Si(O$—$CH_3)$, or AMTMS); dichlorosilane (DCS); trichlorosilane (TCS); vanadium trichloride ($VCl_3$); vanadium acetylacetonate ($V(acac)_3$); niobium pentachloride ($NbCl_5$); niobium ethoxide ($Nb(OCH_2CH_3)_5$); hafnium tetrachloride ($HfCl_4$), etc.

After a sufficient time for the metal source gas to saturate surfaces of the bottom electrode, shutting off the flow of the metal source gas ends the metal pulse 104. Preferably, carrier gas continues to flow in a purge 106 until the metal source gas is purged from the chamber.

During the pulse 104, the metal source gas reacts with exposed surfaces of the workpiece to deposit or chemisorb a "monolayer" of metal complex. While theoretically the reactants will chemisorb at each available site on the exposed layer of the workpiece, physical size of the adsorbed complex (particularly with large terminating ligands) will generally limit coverage with each cycle to a fraction of a monolayer. In the example of Table I, the ALD process grows metal oxide layers at roughly 1 Å/cycle, such that a full monolayer effectively forms from material deposited approximately every 3 cycles for $Al_2O_3$, which has a bulk lattice parameter of about 3 Å. Each cycle is represented by a pair of metal source gas and oxygen source gas pulses. "Monolayer," as used herein, therefore represents a fraction of a monolayer during deposition, referring primarily to the self-limiting effect of the pulse 104.

In particular, the metal-containing species provided to the workpiece is self-terminating such that the adsorbed complex surface will not further react with the metal source gas. In the examples set forth below, TMA (Table I) leaves a monolayer of methyl-terminated aluminum. Tantalum ethoxide (Table II) leaves a monolayer of ethoxide tantalum. Similarly, other volatile metal halides will leave halide-terminated surfaces, and metallorganic precursors will leave surface terminated with organic ligands. Such surfaces do not further react with the metal source or other constituents of the reactant flow during the metal source gas pulse 104. Because excess exposure to the reactants does not result in excess deposition, the chemistry during the metal phase 107 of the process is said to be saturative or self-limiting. Despite longer exposure to a greater concentration of reactants, deposition on upper surfaces of HSG silicon grains does not exceed deposition in neck regions between grains.

In a second phase 111 of the cycle 115, a pulse 108 of an oxygen source gas is then provided to the workpiece. In the illustrated examples, the oxygen source gas comprises water vapor ($H_2O$) or ozone. Other suitable oxidants include: hydrogen peroxide ($H_2O_2$); methanol ($CH_3OH$); ethanol ($CH_3CH_2OH$), nitrous oxide ($N_2O$, $NO_2$); O radicals; etc. Radicals can be provided by remote plasma sources connected to the reaction chamber, and an ozone generator can similarly provide ozone ($O3$). Preferably, the second phase 111 is maintained for sufficient time to fully expose the monolayer of metal complex left by the first phase 107 to the oxygen source gas. After a sufficient time for the oxygen source gas to saturate the metal-containing monolayer over the HSG silicon layer, shutting off the flow of the oxygen source gas ends the oxygen pulse 108. Preferably, carrier gas continues to flow in a purge step 110 until the oxygen source gas is purged from the chamber.

During the oxygen pulse 108, the oxygen source gas reacts with or chemisorbs upon the self-terminated metal complex monolayer left by the first phase 107. In the illustrated embodiments, this chemisorption comprises a saturative ligand-exchange reaction, replacing the organic ligand or halide termination of the metal-containing monolayer with oxygen or an oxygen complex. Metal oxide is thereby formed, preferably in a single monolayer. Desirably, the process leaves a stoichiometric metal oxide, with hydroxyl and oxygen bridge termination. As discussed with respect to the metal phase 107, the monolayer need not occupy all available sites, due the physical size of the adsorbed complex. However, the second phase 111 also has a self-limiting effect.

In particular, the oxygen source gas reacts with the ligand of the metal complex chemisorbed onto the workpiece surface during the previous pulse of metal source gas. The reaction is also surface limiting or terminating, since the oxidant during the pulse 108 will not react with the hydroxyl and oxygen bridge termination of the metal oxide monolayer. Moreover, temperature and pressure conditions are arranged to avoid diffusion of the oxidant through the metal monolayer to underlying materials. Despite longer exposure to a greater concentration of reactants in this saturative, self-limiting reaction phase 111, the thickness of the metal oxide formed on upper surfaces of the HSG silicon grains does not exceed the thickness of the metal oxide formed in the neck regions between grains.

The metal phase 107 (including metal source pulse 104 and purge 106) and oxygen phase 108 (including oxygen source pulse 108 and purge 110) together define a cycle 15 that is repeated in an ALD process. After the initial cycle 115, a second cycle 115a is conducted, wherein a metal source gas pulse 104a is again supplied. The metal source gas chemisorbs a metal complex on the surface of the metal oxide formed in the previous cycle 115. The metal-containing species readily react with the exposed surface, depositing another monolayer or fraction of a monolayer of metal complex and again leaving a self-terminated surface that does not further react with the metal source gas. Metal source gas flow 104a is stopped and purged 106a from the chamber, and a second phase 111a of the second cycle 115a provides oxygen source gas to oxidize the second metal monolayer.

The cycle 115a is repeated at least about 10 times, and more preferably at least about 20 times, until a sufficiently thick metal oxide is formed to avoid leakage during memory cell operation. Advantageously, layers having a uniform thickness between about 10 Å and 200 Å, and more preferably between about 25 Å and 100 Å, can be formed with near perfect step coverage by the methods of the preferred embodiments.

The tables below provide exemplary process recipes for forming metal oxide and ternary dielectric layers suitable for capacitor dielectric applications in DRAM memory cells for ultra large scale integrated processing. The dielectrics are particularly suited to deposition over HSG silicon. Each of the process recipes represents one cycle in a single-wafer process module. In particular, the illustrated parameters were developed for use in the single-wafer ALD module commercially available under the trade name Pulsar 2000™, available commercially from ASM Microchemistry Ltd. of Finland.

Note that the parameters in the tables below are exemplary only. Each process phase is desirably arranged to saturate the bottom electrode surfaces. Purge steps are arranged to remove reactants between reactive phases from the reaction chamber. The illustrative ALD processes achieve better than about 95% thickness uniformity, and more preferably greater than about 98% thickness uniformity over HSG grains with average gain sizes of about 400 Å. Thickness uniformity, as used herein, is defined as a thickness minimum as a percentage of the thickness maximum. In view of the disclosure herein, the skilled artisan can readily modify, substitute or otherwise alter deposition conditions for different reaction chambers and for different selected conditions to achieve saturated, self-terminating phases at acceptable deposition rates.

Advantageously, the ALD processes described herein are relatively insensitive to pressure and reactant concentration, as long as the reactant supply is sufficient to saturate the textured surfaces. Furthermore, the processes can operate at low temperatures. Workpiece temperature is preferably maintained throughout the process between about 150° C. and 350° C. to achieve relatively fast deposition rates while conserving thermal budgets. More preferably, the temperature is maintained between about 220° C. and 300° C., depending upon the reactants. Pressure in the chamber can range from the milliTorr range to super-atmospheric, but is preferably maintained between about 1 Torr and 500 Torr, more preferably between about 1 Torr and 10 Torr.

TABLE I $Al_2O_3$

| Phase | Carrier Flow (sccm) | Reactant | Reactant Flow (sccm) | Temperature (° C.) | Pressure (Torr) | Time (sec) |
|---|---|---|---|---|---|---|
| metal | 400 | TMA | 20 | 300 | 5 | 0.1 |
| purge | 400 | — | — | 300 | 5 | 0.2 |
| oxidant | 400 | $H_2O$ | 40 | 300 | 5 | 0.1 |
| purge | 400 | — | — | 300 | 5 | 0.6 |

Table I above presents parameters for ALD of an aluminum oxide ($Al_2O_3$) dielectric over HSG silicon. The exemplary metal source gas comprises trimethyl aluminum (TMA), the carrier gas comprises nitrogen ($N_2$) and the oxygen source gas preferably comprises water vapor ($H_2O$). The temperature during the process is preferably kept between about 150° C. and 350° C., and more preferably at about 300° C.

In the first phase of the first cycle, TMA chemisorbs upon the HSG silicon surfaces of the bottom electrode. The metal source gas preferably comprises a sufficient percentage of the carrier flow, given the other process parameters, to saturate the bottom electrode surfaces. A monolayer of aluminum complex is left upon the HSG silicon surfaces, and this monolayer is self-terminated with methyl tails.

After the TMA flow is stopped and purged by continued flow of carrier gas, a pulse of $H_2O$ is supplied to the workpiece. The water readily reacts with the methyl-terminated surface of the metal monolayer in a ligand-exchange reaction, forming a monolayer of aluminum oxide ($Al_2O_3$). The reaction is limited by the number of available metal complexes previously chemisorbed. The reaction is furthermore self-limiting in that neither water nor the carrier gas further reacts with the hydroxyl and oxygen bridge termination of the resulting aluminum oxide monolayer. The preferred temperature and pressure parameters, moreover, inhibit diffusion of water or reaction by-products through the metal monolayer.

In the next cycle, the first phase introduces TMA, which readily reacts with the surface of the aluminum oxide monolayer, again leaving a methyl-terminated aluminum layer above the first metal oxide layer. The second phase of the second cycle is then as described with respect to the first cycle. These cycles are repeated until the desired thickness of aluminum oxide is formed.

In the illustrated embodiment, carrier gas continues to flow at a constant rate during both phases of each cycle. It will be understood, however, that reactants can be removed by evacuation of the chamber between alternating gas pulses. In one arrangement, the preferred reactor incorporates hardware and software to maintain a constant pressure during the pulsed deposition. The disclosures of U.S. Pat. No. 4,747,367, issued May 31, 1988 to Posa and U.S Pat. No. 4,761,269, issued Aug. 2, 1988 to Conger et al., are incorporated herein by reference.

Radicals provided by plasma generators can facilitate deposition of metal-containing layers at the low temperatures of ALD processing. Structures and methods of depositing layers with radical enhancement are provided in patent application having Ser. No. 09/392,371, filed Sep. 8, 1999 and entitled IMPROVED APPARATUS AND METHOD FOR GROWTH OF A THIN FILM, the disclosure of which is incorporated by reference hereinabove. Another exemplary ALD process flow is provided in U.S. Pat. No. 5,916, 365 to Shermnan, issued Jun. 29, 1999, the disclosure of which is incorporated herein by reference.

TABLE II $Ta_2O_5$

| Phase | Carrier Flow (sccm) | Reactant | Reactant Flow (sccm) | Temperature (° C.) | Pressure (Torr) | Time (sec) |
|---|---|---|---|---|---|---|
| metal | 400 | $Ta(OCH_2CH_3)_5$ | 40 | 220 | 5 | 1 |
| purge | 400 | — | — | 220 | 5 | 1 |
| oxidant | 400 | $O_3$ | 100 | 220 | 5 | 1 |
| purge | 400 | — | — | 220 | 5 | 2 |

Table II above presents parameters for ALD of a tantalum oxide ($Ta_2O_5$) over HSG silicon of a capacitor bottom electrode. Preferably, the illustrated dielectric deposition is preceded by formation of a barrier layer to protect the HSG silicon from oxidation. In the illustrated embodiment, a dielectric barrier is formed, specifically comprising silicon nitride ($Si_3N_4$). Advantageously, silicon nitride can be formed over HSG silicon with near perfect conformality by thermally nitriding the silicon surfaces. In other arrangements, a thin oxide layer can be first grown (e.g., by thermal oxidation) over the HSG silicon, followed by thermal nitridation of the oxide surface, as is known in the art.

Following formation of the barrier layer, $Ta_2O_5$ is formed in an ALD process. As indicated in Table II, the illustrated metal source gas comprises tantalum ethoxide (Ta $(OCH_2CH_3)_5$); the carrier gas comprises nitrogen ($N_2$); and the oxygen source gas preferably comprises ozone ($O_3$). The temperature during the process is preferably kept between about 150° C. and 300° C., and more preferably at about 220° C.

In the first phase of the first cycle, tantalum ethoxide chemisorbs upon the nitridized surfaces of the HSG silicon. The metal source gas preferably comprises a sufficient percentage of the carrier flow, given the other process parameters, to saturate the nitride-coated HSG silicon surfaces. A monolayer of tantalum complex is left upon the textured surfaces, and this monolayer is self-terminated with ethoxide tails.

After the metal source gas flow is stopped and purged by continued flow of carrier gas, a pulse of ozone is supplied to the workpiece. Ozone preferably comprises a sufficient percentage of the carrier flow, given the other process parameters, to saturate the surface of the metal-containing monolayer. The ozone readily reacts with the ethoxide-terminated surface of the metal-containing monolayer in a ligand-exchange reaction, forming a monolayer of tantalum oxide ($Ta_2O_5$). The reaction is limited by the number of available metal complexes previously chemisorbed. Neither ozone nor the carrier gas further reacts with the resulting tantalum oxide monolayer. Ozone causes the organic ligand to burn, liberating $CO_2$ and $H_2O$, and the monolayer is left with hydroxyl and oxygen bridge termination. The preferred temperature and pressure parameters, moreover, inhibit diffusion of ozone and reaction by-products through the metal monolayer.

In the next cycle, the first phase introduces tantalum ethoxide, which readily reacts with the surface of the tantalum oxide monolayer, again leaving an ethoxide-terminated tantalum layer. The second phase of the second cycle is then as described with respect to the first cycle. These cycles are repeated until the desired thickness of tantalum oxide is formed. Preferably, between about 80 and 200 cycles are conducted to grow between about 40 Å and 100 Å of $Ta_2O_5$. More preferably, between about 80 and 100 cycles are conducted to grow between about 40 Å and 50 Å.

In the illustrated embodiment, carrier gas continues to flow at a constant rate during both phases of each cycle. It will be understood, however, that reactants can be removed by evacuation of the chamber between alternating gas pulses. In one arrangement, the preferred reactor incorporates hardware and software to maintain a constant pressure during the pulsed deposition. The disclosures of U.S. Pat. No. 4,747,367, issued May 31, 1988 to Posa and U.S. Pat. No. 4,761,269, issued Aug. 2, 1988 to Conger et al., are incorporated herein by reference.

An amorphous $Ta_2O^5$, dielectric layer is left with only trace amounts of carbon. This layer can be annealed for a crystallized dielectric, if desired. The dielectric constant of the layer is between about 20 and 25.

TABLE III $Ta_2O_5$

| Phase | Carrier Flow (sccm) | Reactant | Reactant Flow (sccm) | Temperature (° C.) | Pressure (Torr) | Time (sec) |
|---|---|---|---|---|---|---|
| metal | 400 | $TaCl_5$ | 40 | 300 | 5 | 0.5 |
| purge | 400 | — | — | 300 | 5 | 0.5 |
| oxidant | 400 | $H_2O$ | 40 | 300 | 5 | 0.5 |
| purge | 400 | — | — | 300 | 5 | 0.5 |

Table III above presents parameters for another ALD process for depositing tantalum oxide ($Ta_2O_5$) over HSG silicon of a capacitor bottom electrode. Following formation of the silicon nitride barrier layer, as described above, $Ta_2O_5$ is formed in an ALD process. As indicated in Table III, the preferred metal source gas comprises tantalum chloride ($TaCl_5$); the carrier gas again comprises nitrogen ($N_2$); and the oxygen source gas preferably comprises water vapor ($H_2O$). Temperatures during the process are preferably between about 150° C. and 300° C., and more preferably about 300° C.

In the first phase of the first cycle, tantalum chloride chemisorbs upon the silicon nitridized surfaces of the HSG. The metal source gas preferably comprises a sufficient percentage of the carrier flow, given the other process parameters, to saturate the nitride-coated HSG silicon surfaces. A monolayer of tantalum complex is left upon the textured surfaces, and this monolayer is self-terminated with chloride tails.

After the $TaCl_5$ flow is stopped and purged by continued flow of carrier gas, a pulse of water vapor is supplied to the workpiece. Water vapor preferably comprises a sufficient percentage of the carrier flow, given the other process parameters, to saturate the surface of the metal-containing monolayer. The water readily reacts with the chloride-terminated surface of the metal-containing monolayer in a ligand-exchange reaction, forming a monolayer of tantalum oxide ($Ta_2O_5$). The reaction is limited by the number of available metal chloride complexes previously chemisorbed. Neither water nor the carrier gas further reacts with the hydroxyl and oxygen bridge termination of the resulting tantalum oxide monolayer. The preferred temperature and pressure parameters, moreover, inhibit diffusion of water and reaction by-products through the metal monolayer.

In the next cycle, the first phase introduces $TaCl_5$, which readily reacts with the surface of the tantalum oxide monolayer, again leaving a chloride-terminated tantalum layer. The second phase of the second cycle is then as described with respect to the first cycle. These cycles are repeated until the desired thickness of tantalum oxide is formed, as described with respect to the preceding example.

As mentioned above, the chamber can be evacuated to remove reactants between pulses, rather than purged by a steady carrier gas flow as shown, though inter-pulse purging is preferred.

An amorphous $Ta_2O_5$ dielectric layer is left with only trace amounts of chlorine. This layer can be annealed for a crystallized dielectric, if desired. The dielectric constant of the layer is between about 20 and 25.

TABLE IV $ZrO_2$

| Phase | Carrier Flow (sccm) | Reactant | Reactant Flow (sccm) | Temperature (° C.) | Pressure (Torr) | Time (sec) |
|---|---|---|---|---|---|---|
| metal | 400 | $ZrCl_4$ | 5 | 300 | 5 | 0.5 |
| purge | 400 | — | — | 300 | 5 | 3 |
| oxidant | 400 | $H_2O$ | 40 | 300 | 5 | 2 |
| purge | 400 | — | — | 300 | 5 | 6 |

Table IV above presents parameters for ALD of zirconium oxide ($ZrO_2$). As noted, the metal source comprises zirconium chloride ($ZrCl_4$); the carrier gas comprises nitrogen ($N_2$); and the oxygen source gas preferably comprises water vapor ($H_2O$). During each of the reaction phases, the reactants are supplied in sufficient quantity for the given other parameters to saturate the surface. Temperatures during the process preferably fall between about 200° C. and 500° C. For an amorphous $ZrO_2$ layer, the temperature is more preferably at the low end of this range, between about 200° C. and 250° C., and most preferably at about 225° C. For a crystalline film, the temperature is more preferably at the high end of this range, between about 250° C. and 500° C., and most preferably about 300° C. As will be appreciated by the skilled artisan, however, mixtures of amorphous and crystalline composition result at the boundary of these two regimes. The illustrated process produces a largely crystalline $ZrO_2$ film.

In this case, the metal monolayer formed in the metal phase is self-terminated with chloride, which does not readily react with excess $ZrCl_4$ under the preferred conditions. The preferred oxygen source gas. However, reacts with or adsorbs upon the chloride-terminated surface during the oxygen phase in a ligand-exchange reaction limited by the supply of zirconium chloride complexes previously adsorbed. Moreover, oxidation leaves a hydroxyl and oxygen bridge termination that does not further react with excess oxidant in the saturative phase.

Preferably, between about 30 and 80 cycles are conducted to grow between about 20 Å and 60 Å of $ZrO_2$. More preferably, between about 30 and 50 cycles are conducted to grow between about 20 Å and 40 Å. The dielectric constant of the layer is between about 18 and 24.

TABLE V $TiO_2$

| Phase | Carrier Flow (sccm) | Reactant | Reactant Flow (sccm) | Temperature (° C.) | Pressure (Torr) | Time (sec) |
|---|---|---|---|---|---|---|
| metal | 400 | $TiCl_4$ | 20 | 300 | 5 | 0.5 |
| purge | 400 | — | — | 300 | 5 | 3 |

TABLE V-continued

TiO$_2$

| Phase | Carrier Flow (sccm) | Reactant | Reactant Flow (sccm) | Temperature (° C.) | Pressure (Torr) | Time (sec) |
|---|---|---|---|---|---|---|
| oxidant | 400 | H$_2$O | 40 | 300 | 5 | 2 |
| purge | 400 | — | — | 300 | 5 | 6 |

Table V above presents parameters for ALD of titanium oxide (TiO$_2$). As noted, the metal source comprises titanium tetrachloride (TiCl$_4$); the carrier gas comprises nitrogen (N$_2$); and the oxygen source gas preferably comprises water vapor (H$_2$O). During each of the reaction phases, the reactants are supplied in sufficient quantity for the given other parameters to saturate the surface.

As described with respect to ZrO$_2$ in the preceding example, temperatures is preferably kept at a level between about 200° C. and 500° C. In the illustrated embodiment, however, the illustrated embodiment employs a temperature between about 250° C. and 500° C., and most preferably about 300° C.

In this case, the metal monolayer formed in the metal phase is self-terminated with chloride, which does not readily react with TiCl$_4$ under the preferred conditions. The preferred oxygen source gas, however, reacts with or adsorbs upon the chloride-terminated surface during the oxygen phase in a reaction limited by the supply of titanium chloride complexes previously adsorbed. Moreover, oxidation leaves a hydroxyl and oxygen bridge and termination that does not further react with excess oxidant in the saturative phase.

Preferably, between about 30 and 80 cycles are conducted to grow between about 20 Å and 60 Å of TiO$_2$. More preferably, between about 30 and 50 cycles are conducted to grow between about 20 Å and 40 Å. The dielectric constant of the layer is between about 15 and 25.

Method of Forming Ternary Dielectric Layers

As discussed with respect to FIG. 4B, the principles of ALD described above with respect to metal oxide capacitor dielectrics, can also be extended to depositing ternary materials and more complex materials.

Figure 6:
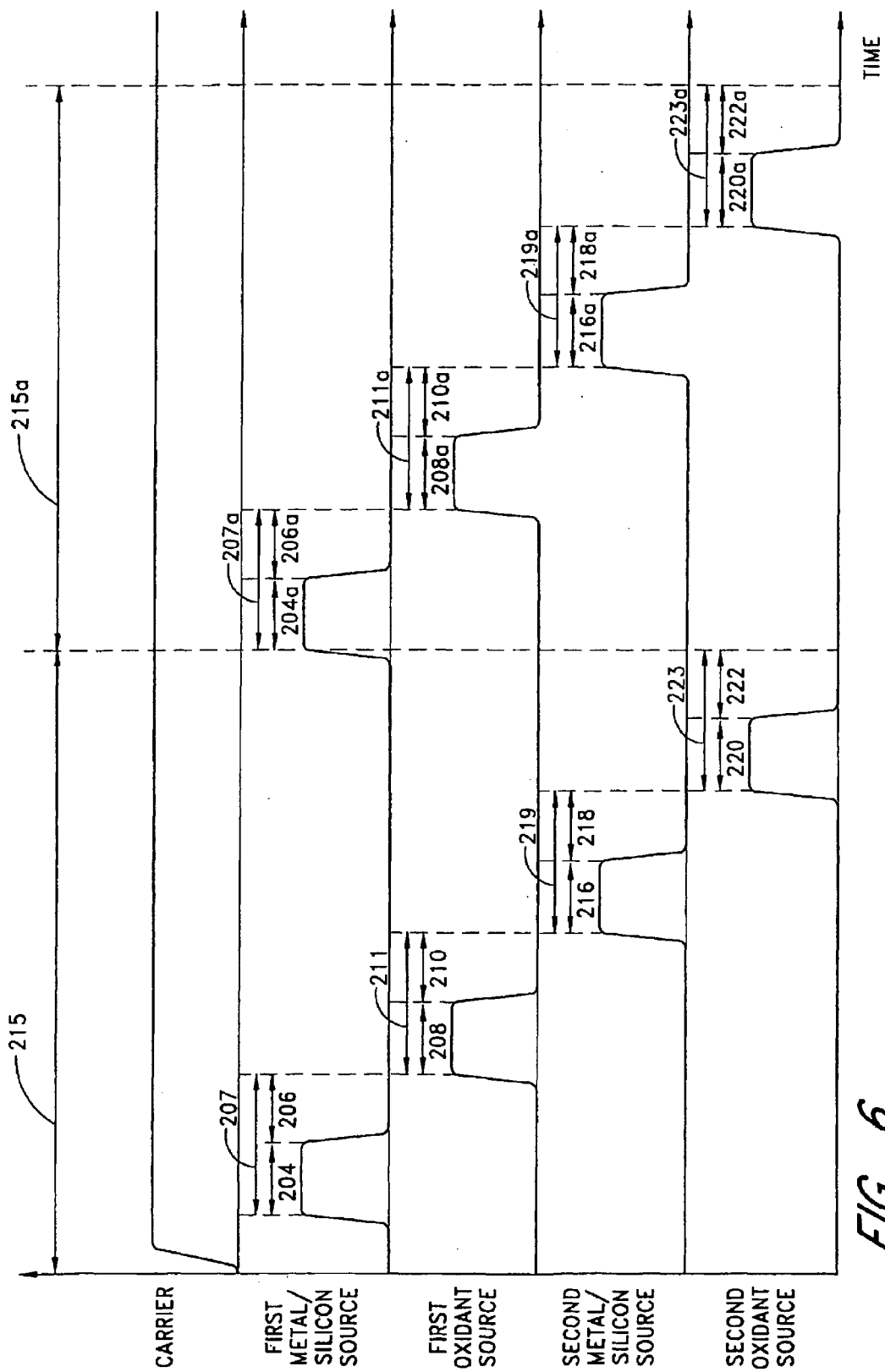
FIG. 6 is an exemplary gas flow diagram for depositing a ternary dielectric layer, in accordance with another preferred embodiment.

With reference to FIG. 6, a gas flow schematic is shown for a general process of forming ternary structures, specifically for forming mixed or compound metal oxides or metal silicates. Though the example of Table VI below relates to a metal silicate layer, formed by metal/oxygen1/silicon/oxygen2 phases, in that order, the skilled artisan will readily appreciate that the disclosed sequence can be altered for silicate materials (e.g., silicon/oxygen/metal/oxygen) or adapted for complex metal oxides (e.g., first metal/oxygen/second metal/oxygen). Furthermore, the illustrated sequence can be extended to encompass more complex materials incorporating multiple elements. For convenience, the reference numerals of FIG. 4B are utilized to refer to like process steps, phases and sequences.

As illustrated, the process comprises four phases to each cycle, wherein each phase comprises a reactant phase and a purge phase. A first metal or silicon phase 207 is followed by a first oxygen phase 211, a second metal or silicon phase 219, and a second oxygen phase 223, in sequence. The cycle is then repeated. As previously noted, in other arrangements, the first or fourth phase can be omitted every cycle or every few cycles, if a low oxygen content is desired. In such a case, chemistries should be selected to permit reaction between deposited monolayers and subsequent chemistries. As will be better understood from the discussion of Table VI below, the first oxygen source (in the second phase 211) can be, but is not necessarily, the same as the second oxygen source (in the fourth phase 223). After four phases 207, 211, 219, 223 complete the first cycle 215, a second, similar cycle 215a can be conducted to continue ternary growth. These cycles 215, 215a continues until the ternary material of interest is thick enough to avoid current leakage but thin enough to exhibit high capacitance.

In general, the process enables dielectric layers having mixed metal oxides, ternary metal oxide compounds, metal silicates, or more complex dielectric materials. For example, TiO$_2$ can be mixed with Ta$_2$O$_5$ by alternating cycles. A largely binary cycle can be repeated several times between ternary cycles, if only a slight doping effect is desired. The example of Table VI below, however, a zirconium silicon oxide or "zirconium silicate" layer is illustrated.

TABLE VI

Zirconium silicon oxide

| Phase | Carrier Flow (sccm) | Reactant | Reactant Flow (sccm) | Temperature (° C.) | Pressure (Torr) | Time (sec) |
|---|---|---|---|---|---|---|
| metal | 400 | ZrCl$_4$ | 40 | 300 | 5 | 0.5 |
| purge | 400 | — | — | 300 | 5 | 3 |
| oxygen | 400 | H$_2$O | 40 | 300 | 5 | 2 |
| purge | 400 | — | — | 300 | 5 | 6 |
| silicon | 400 | AMTMS | 40 | 300 | 5 | 1 |
| purge | 400 | — | — | 300 | 5 | 2 |
| oxygen | 400 | O$_3$ | 40 | 300 | 5 | 3.5 |
| purge | 400 | — | — | 300 | 5 | 1 |

Table VI above presents parameters for ALD of zirconium silicon oxide or zirconium silicate (ZrSi$_x$O$_y$). As noted in Table VI, the first reactant source comprises a source of metal for the compound to be formed. In particular, zirconium chloride (ZrCl$_4$) supplies the metal. Other process gases include the carrier gas, comprising nitrogen (N$_2$) in the illustrated embodiment, and a silicon source gas, preferably comprising 3-aminopropyltrimethoxsilane (NH$_2$CH$_2$CH$_2$CH$_2$—Si(O—CH$_3$)$_3$ or AMTMS). Other suitable silicon gas sources include various organosilane and halosilane gases. During each of the reaction phases, the reactants are supplied in sufficient quantity for the given other parameters to saturate the surface.

In the illustrated sequence, a metal phase is followed by an oxygen phase, which is in turn followed by a silicon phase and a second oxygen phase. The cycle then repeats. While the illustrated example employs two different oxygen source gases for the first and second oxygen phases (second and fourth phases) of each cycle, the same oxygen source could alternatively be employed for both phases.

During the metal phase, a zirconium-containing monolayer is self-terminated with chloride tails. The termination of this monolayer does not readily react with ZrCl$_4$ under the preferred conditions. In the next phase, water vapor oxidizes the metal containing monolayer, replacing chloride termination with hydroxyl and oxygen bridge termination. Then the preferred silicon source gas reacts with or adsorbs upon the hydroxyl and oxygen bridge termination during the silicon phase in a ligand-exchange reaction limited by the supply of metal oxide complexes previously adsorbed. Moreover, the preferred silicon source gas leaves an organic (ethoxide) or halide (chloride) termination that does not further react with excess silicon ethoxide in the saturative phase. Finally, ozone oxidizes the previously adsorbed silicon-containing monolayer to leave a ternary oxide.

As will be appreciated by the skilled artisan, ternary structures such as the illustrated zirconium silicate ($ZrSi_xO_y$) layer advantageously exhibit higher dielectric constants, less operational leakage, and more stable structures interfacing with silicon. The ratio of Zr:Si can be controlled for optimal properties, depending upon the relative number of four-phase cycles conducted as compared to two-phase (simple metal) in the same process. Accordingly, the zirconium silicate is not necessarily stoichiometric.

Preferably, between about 20 and 100 cycles are conducted to grow between about 20 Å and 100 Å of $ZrSi_xO_y$. More preferably, between about 20 and 40 cycles are conducted to grow between about 20 Å and 40 Å. The dielectric constant of the layer is between about 10 and 15.

Method of Forming Dielectric Stacks

In contrast to the mixed or compound structures produced by the process of FIGS. 4B and 6, the capacitor dielectric can also comprise a stack of distinct dielectric sublayers. An exemplary stack includes between about 5 and 40 and more preferably about 10 alternating layers of $Ta_2O_5$ and $TiO_2$.

Figure 9:
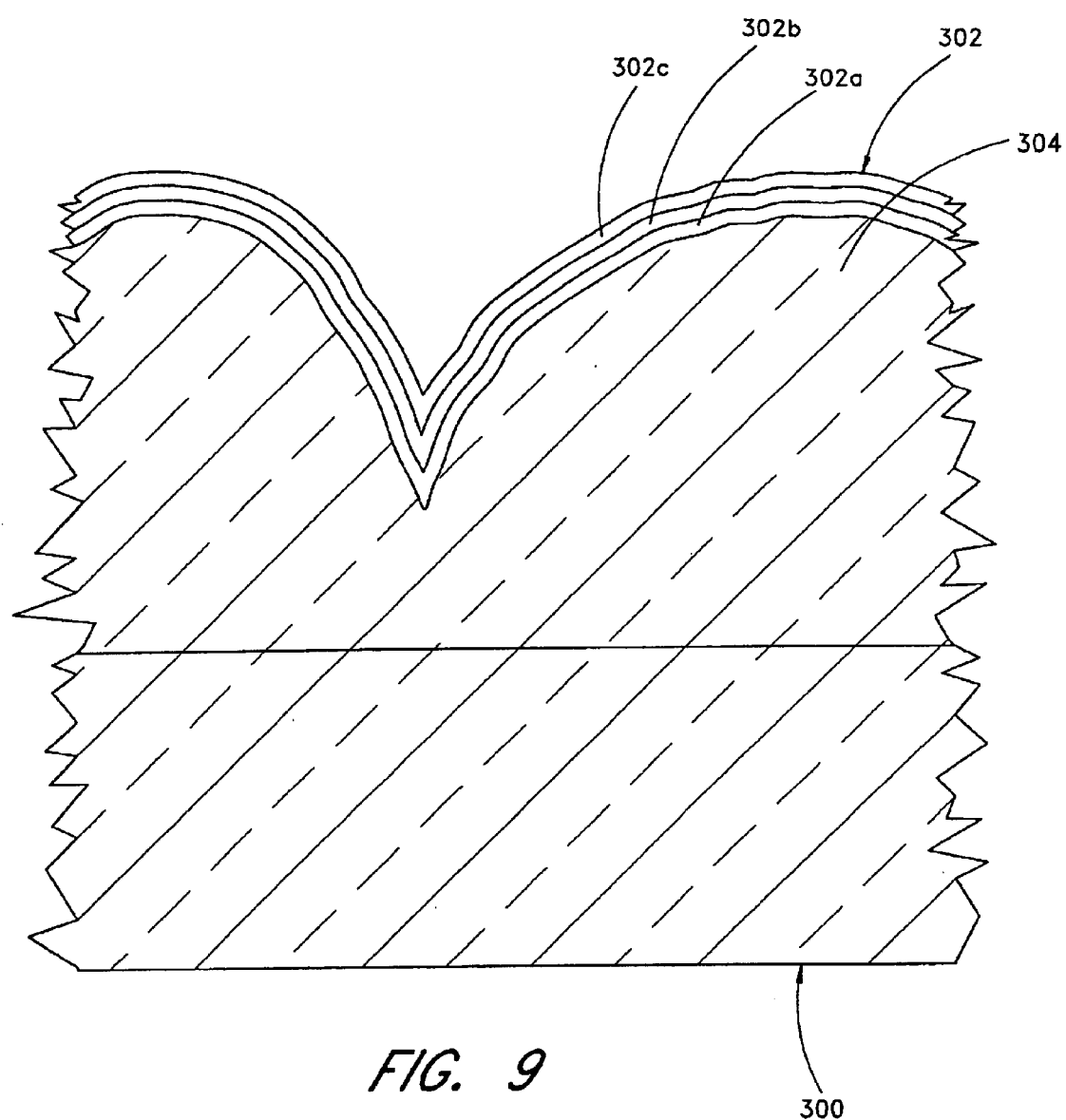
FIG. 9 is a partial, schematic cross-section of a partially fabricated memory cell capacitor, including a nanolaminate dielectric over HSG silicon.

Preferably at least one of the sublayers, and more preferably all of the sublayers, is formed by ALD in accordance with the methods disclosed above. FIG. 9 illustrates an exemplary capacitor formed by this process, discussed in more detail below.

In the illustrated embodiments, a process as described above preferably conducted for between about 10 and 100 cycles, producing a high k dielectric layer having a thickness of between about 5 Å and 50 Å (assuming about 0.5 Å/cycle). Another dielectric material is preferably also deposited, and also formed to thickness of between about 5 Å and 50 Å. In an exemplary process flow, the process of Table II above is alternated, after forming about 5 Å of $Ta_2O_5$, with the process of Table V, whereby about 5 Å of $TiO_2$ is formed, and so on until a suitable thickness is reached for memory cell capacitor applications.

As with the mixed or compound layers described with respect to Table VI, dielectric stacks or "nanolaminates" so formed tend to exhibit enhanced dielectric properties and more stable structures in contact with silicon.

Methods of Forming Top Electrode Materials

After formation of the dielectric layer, a top electrode is formed over the capacitor dielectric. If the top electrode does not perfectly conform to the dielectric, the full benefit of the textured bottom electrode and conformal dielectric is not realized. Accordingly, the top electrode formed over the capacitor dielectric preferably includes at least one conductive thin film that is also deposited with near perfect conformality by an ALD process.

The top electrode is desirably relatively thick for high lateral conductivity across a memory array and/or to land contacts thereupon without risking spikes through the capacitor dielectric. However, the preferred alternating deposition process need not form the full thickness of the top electrode. Rather, one or more initial thin conductive layers can be conformally formed by the preferred alternating process, followed by convention deposition for the bulk of the top electrode thickness. The alternating process provides a conductive coating in continuous direct contact with the capacitor dielectric, thus conforming to the undulations of the underlying textured bottom electrode. The remainder of the top electrode, deposited by conventional means, need not be conformal. Furthermore, voids can be tolerated between the initial, conformal thin film(s) and the remainder of the top electrode thickness, as long as the initial thin film is adequately connected into the circuitry of the integrated circuit.

The initial conductive thin film(s) can comprise any suitable conductive material, including silicon, metal nitrides and elemental metals, composites thereof and nanolaminates thereof Depending upon the material of the dielectric capacitor, a barrier layer may be desired over the dielectric. Particularly when employing $Ta^2O_5$, a barrier thereover prevents oxidation of the remainder of the top electrode. The remainder of the top electrode can then be completed by conventional deposition of a conductive film, such as silicon or metal.

In the example of Table VII below, the top electrode comprises a conductive metal nitride, which can serve as a barrier layer over $Ta_2O_5$, deposited by an ALD process to conformally and continuously coat the capacitor dielectric. The example of Table VIII below the top electrode comprises an elemental metal layer, which can overlie or replace the barrier of Table VII, also formed by an ALD process.

TABLE VII

| | | | TiN | | | |
|---|---|---|---|---|---|---|
| Phase | Carrier Flow (sccm) | Reactant | Reactant Flow (sccm) | Temperature (° C.) | Pressure (Torr) | Time (sec) |
| metal | 400 | $TiCl_4$ | 20 | 400 | 10 | 1 |
| purge | 400 | — | — | 400 | 10 | 1 |
| nitrogen | 400 | $NH_3$ | 100 | 400 | 10 | 2 |
| purge | 400 | — | — | 400 | 10 | 4 |

Table VII above presents parameters for ALD of a conformal metal nitride barrier over a capacitor dielectric. The process is similar to that of FIGS. 4A and 5, except that the oxygen source gas is substituted with a nitrogen source gas. Accordingly, one of the reactant species preferably includes a metal-containing species with an organic or halide ligand, while a second reactant species includes a nitrogen-containing species. In the illustrated embodiment, the metal film comprises a titanium nitride (TiN) film formed by ALD in alternating, self-limiting metal and nitrogen phases separated by purge steps. In the example of Table VII, the exemplary metal source gas comprises titanium tetrachloride ($TiCl_4$), the carrier gas comprises nitrogen ($N_2$) and the nitrogen source gas preferably comprises ammonia ($NH_3$).

In the first phase of the first cycle, $TiCl_4$ chemisorbs upon the hydroxyl and oxygen bridge termination of the deposited high k dielectric. The metal source gas preferably comprises a sufficient percentage of the carrier flow, given the other process parameters, to saturate the dielectric surfaces. A monolayer of titanium complex is left upon the dielectric, and this monolayer is self-terminated with halide tails.

Desirably, the reactor includes a catalyst to convert the metal source gas to a smaller and/or more reactive species. In the illustrated embodiment, the preferred reaction chamber comprises titanium walls, which advantageously convert $TiCl_4$ to $TiCl_3^+$. The smaller species readily diffuse into confined spaces, occupy more reactive sites per cycle and more readily chemisorb onto the active sites. Accordingly, the catalyst enables faster deposition rates. The skilled artisan will readily appreciate that other catalysts can be employed for other chemistries.

After the $TiCl_4$ flow is stopped and purged by continued flow of carrier gas, a pulse of $NH_3$ is supplied to the workpiece. Ammonia preferably comprises a sufficient percentage of the carrier flow, given the other process parameters, to saturate the surface of the metal-containing monolayer. The $NH_3$ readily reacts with the chloride-terminated surface of the metal monolayer in a ligand-exchange reaction, forming a monolayer of titanium nitride (TiN). The reaction is limited by the number of available metal chloride complexes previously chemisorbed. Neither ammonia nor the carrier gas further reacts with the resulting titanium nitride monolayer. The preferred temperature and pressure parameters, moreover, inhibit diffusion of ammonia through the metal monolayer.

In the next cycle, the first phase introduces $TiCl_4$, which readily reacts with the surface of the titanium nitride monolayer, again leaving a chloride-terminated titanium layer. The second phase of the second cycle is then as described with respect to the first cycle. These cycles are repeated until a thickness of titanium nitride sufficient to perform a barrier function is formed. Preferably between about 5 nm and 50 nm, more preferably between about 10 nm and 30 nm of metal nitride is formed in this manner.

In the illustrated embodiment, carrier gas continues to flow at a constant rate during both phases of each cycle. It will be understood, however, that reactants can be removed by evacuation of the chamber between alternating gas pulses. In one arrangement, the preferred reactor incorporates hardware and software to maintain a constant pressure during the pulsed deposition. The disclosures of U.S. Pat. No. 4,747,367, issued May 31, 1988 to Posa and U.S. Pat. No. 4,761,269, issued Aug. 2, 1988 to Conger et al., are incorporated herein by reference.

TABLE VIII

| Phase | Carrier Flow (sccm) | Reactant | Reactant Flow (sccm) | Temperature (° C.) | Pressure (Torr) | Time (sec) |
|---|---|---|---|---|---|---|
| metal | 600 | $WF_6$ | 50 | 400 | 10 | 0.25 |
| purge | 600 | — | — | 400 | 10 | 0.5 |
| reduce | 600 | TEB | 40 | 400 | 10 | 0.1 |
| purge | 600 | — | — | 400 | 10 | 0.8 |

Table VIII above presents parameters for ALD of a conformal elemental metal layer over a capacitor dielectric. The process can be conducted immediately following formation of a barrier layer (see Table VII) or directly over the capacitor dielectric. The process is also similar to that of FIGS. 4A and 5, except that the oxygen source gas is substituted with a reducing agent. Accordingly, one of the reactant species preferably includes a metal-containing species with an organic or halide ligand, while a second reactant species includes a strong reducing agent. In the illustrated embodiment, the metal film comprises a tungsten (W) layer formed by ALD, in alternating metal and reducing phases separated by purge steps. In the example of Table VIII, the metal source gas comprises tungsten hexafluoride ($WF_6$), the carrier gas comprises nitrogen gas ($N_2$) and the reducing agent comprises triethyl boron (($CH_3CH_2)_3B$) or TEB.

In the first phase of the first cycle, $WF_6$ chemilsorbs upon the hydroxyl and oxygen bridge termination of the deposited high k dielectric, or upon the termination of a previously formed barrier layer. The metal source gas preferably comprises a sufficient percentage of the carrier flow, given the other process parameters, to saturate the dielectric surfaces. A monolayer of tungsten complex is left upon the dielectric, and this monolayer is self-terminated with halide tails.

After the $WF_6$ flow is stopped and purged by continued flow of carrier gas, a pulse of TEB is supplied to the workpiece. TEB preferably comprises a sufficient percentage of the carrier flow, given the other process parameters, to saturate the surface of the metal-containing monolayer. The TEB readily reduces the halide-terminated surface of the metal-containing monolayer, leaving a monolayer of tungsten. The number of available metal halide complexes previously chemisorbed limits the reaction. Neither TEB nor the carrier gas further reacts with the resulting tungsten monolayer. The preferred temperature and pressure parameters, moreover, inhibit diffusion of TEB through the metal monolayer.

In the next cycle, the first phase introduces $WF_6$, which readily reacts with the surface of the tungsten monolayer, again leaving a halide-terminated tungsten layer. The second phase of the second cycle is then as described with respect to the first cycle. These cycles are repeated until the desired thickness of tungsten is formed. Preferably between about 5 nm, and 50 nm, more preferably between about 10 nm and 30 nm of tungsten ensures continuous and conformal coverage to take full advantage of the high surface area of the underlying bottom electrode and capacitor dielectric.

In the illustrated embodiment, carrier gas continues to flow at a constant rate during both phases of each cycle. It will be understood, however, that reactants can be removed by evacuation of the chamber between alternating gas pulses. In one arrangement, the preferred reactor incorporates hardware and software to maintain a constant pressure during the pulsed deposition. The disclosures of U.S. Pat. No. 4,747,367, issued May 31, 1988 to Posa and U.S. Pat. No. 4,761,269, issued Aug. 2, 1988 to Conger et al., are incorporated herein by reference.

Following ALD formation of the initial conductive thin film(s), preferably by process(es) similar to that of Table VII and/or Table VIII, conventional deposition processes can form the remainder of the top electrode. CVD and even PVD can be utilized to deposit an additional 100 nm to 500 nm of conductive material. Conventional deposition will not generally coat the initial thin film(s) with high step coverage, and therefore will not conform with precision to the underlying texture imposed by the bottom electrode and extended by the highly conformal dielectric and initial conductive thin films. Imperfect step coverage by the bulk deposition, however, will not result in loss of capacitance, since the initial conductive thin film(s) ensure continuous and conformal coverage of the capacitor dielectric by a portion of the top electrode.

Resultant Capacitor Structures

Figure 7:
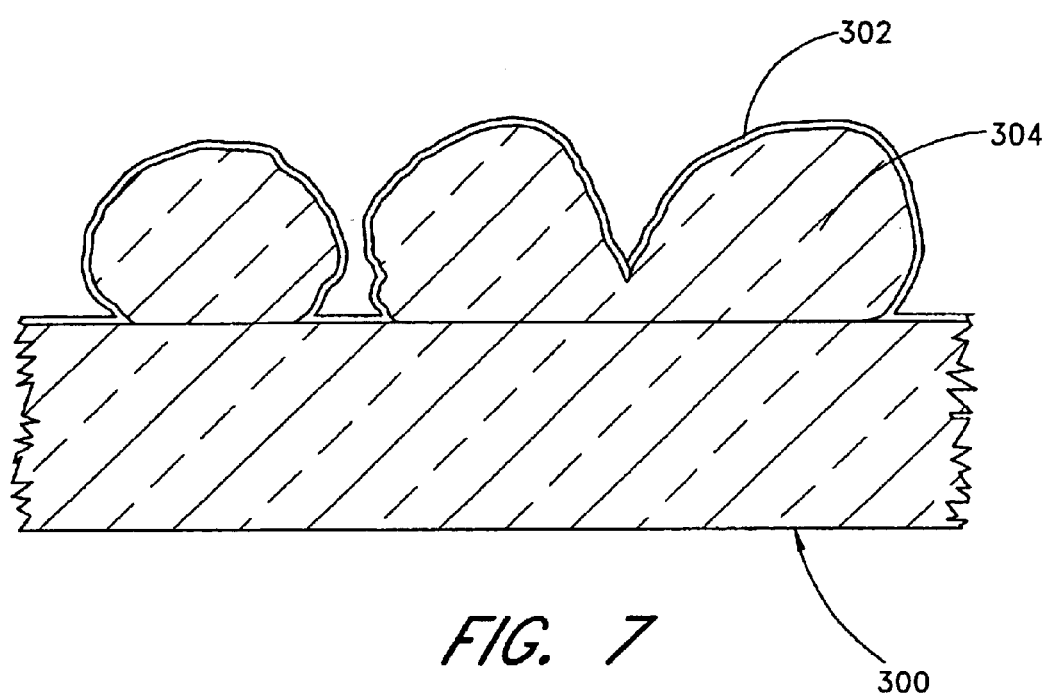
FIG. 7 is a partial, schematic cross-section of a memory cell capacitor, including a conformal ultrathin dielectric over HSG silicon.

Referring now to FIG. 7, a bottom electrode 300 is illustrated with an ultrathin, conformal dielectric layer 302 extending over an HSG layer 304. In accordance with the needs of DRAM capacitors, the dielectric layer is formed to about the minimal thickness necessary to avoid excessive risk of current leakage and consequent data errors. In particular, the dielectric layer 302 coating the bottom electrode 300 preferably has a thickness between about 10 Å and 200 Å, and more preferably between about 25 Å and 100 Å, depending upon the material used.

At the same time, high step coverage provided by the methods disclosed herein enable formation of the desired thickness uniformly over all surfaces of the HSG layer, including top, sidewall, reentrant and neck region surfaces. Accordingly, the dielectric layer 302 over the HSG silicon layer 304 has a minimum thickness that is preferably greater than about 95%, and more preferably greater than about 98% of its maximum thickness at any point of the structure and at any point during the process. In other words, if the maximum thickness is X, preferably at no point over the HSG silicon layer 304 or "lower electrode" is the thickness of the dielectric layer 302 less than about 0.95 times X, and more preferably at no point over the lower electrode is the thickness less than about 0.98 times X.

Under the preferred conditions, material sufficient for a fraction of a monolayer is deposited per cycle, due to the physical size of the chemisorbed complex preventing occupation of all available sites, particularly if the adsorbed complex include organic ligands. In example of Table IV, $ZrO_2$ grows at about 0.75 Å/cycle, such that preferably between about 30 and 80 cycles, and more preferably between about 30 and 50 cycles are performed to produce an adequately thick dielectric layer to avoid operational current leakage and data errors.

The not shown, the skilled artisan will readily appreciate that a top electrode layer is then formed over the dielectric layer 302 and fabrication completed.

Figure 8:
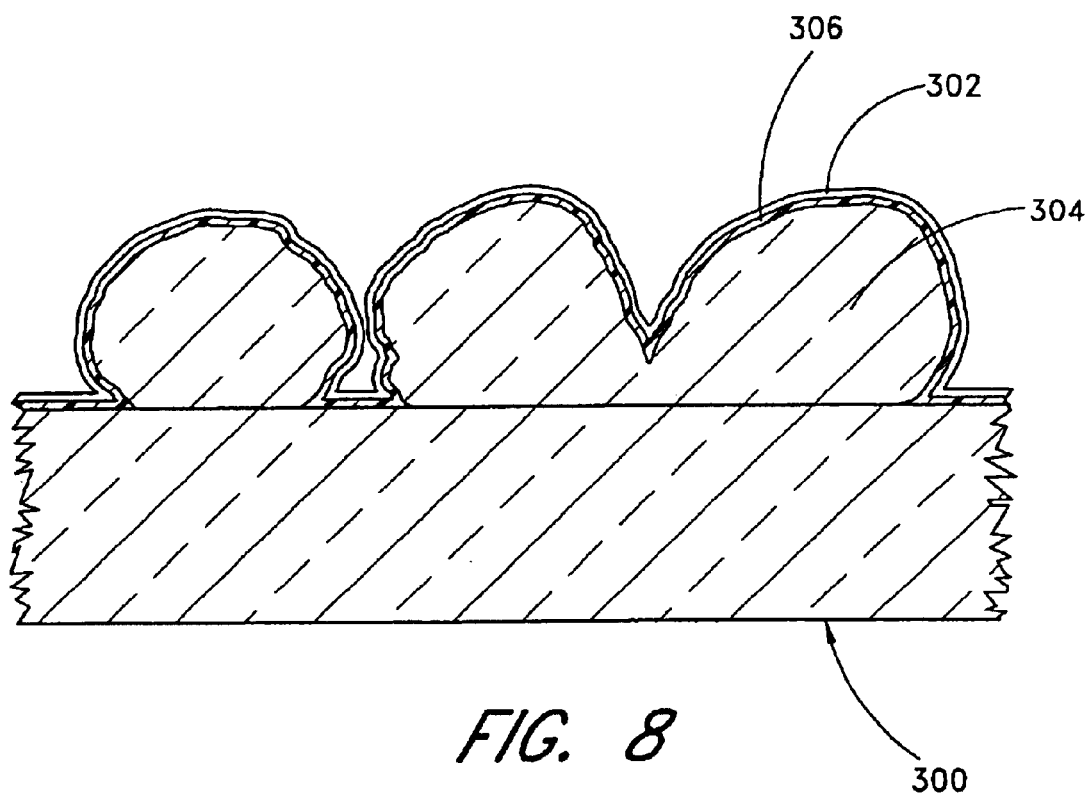
FIG. 8 is a partial, schematic cross-section of a partially fabricated memory cell capacitor, including a conformal ultrathin dielectric over a barrier layer and HSG silicon.

Referring now to FIG. 8, wherein like reference numerals are used for like parts, a similar bottom electrode 300 is shown with a similarly conformal dielectric layer 302 over an HSG silicon layer 304. Additionally, a barrier layer 306 is formed between the dielectric 302 and the HSG silicon surface 304. In accordance with the example of Tables II and III above, for example, a thermally grown silicon nitride layer serves as the barrier layer 306 under a tantalum oxide dielectric 302. Thus, the readily oxidized HSG silicon 304 is somewhat protected against oxidation. Silicon nitride effectively becomes part of the capacitor dielectric, lowering the effective dielectric constant, but better protects the lower electrode 300 from oxidation.

Referring now to FIG. 9, a bottom electrode 300 is schematically shown with an in-progress nanolaminate dielectric 302 conformally extending over an HSG silicon layer 304. The partially fabricated dielectric stack 302 preferably comprises about 3 Å to 10 Å of a first dielectric sublayer 302a (e.g., 5 Å $TiO_2$); about 3 Å to 10 Å of a second dielectric sublayer (e.g., 5 Å $Ta_2O_5$); about 3 Å to 10 Å of third dielectric sublayer (e.g., 5 Å $TiO_2$); etc. As will be appreciated, several additional layers of the same or different construction can be added to complete a leakage-free memory cell capacitor.

Figure 10:
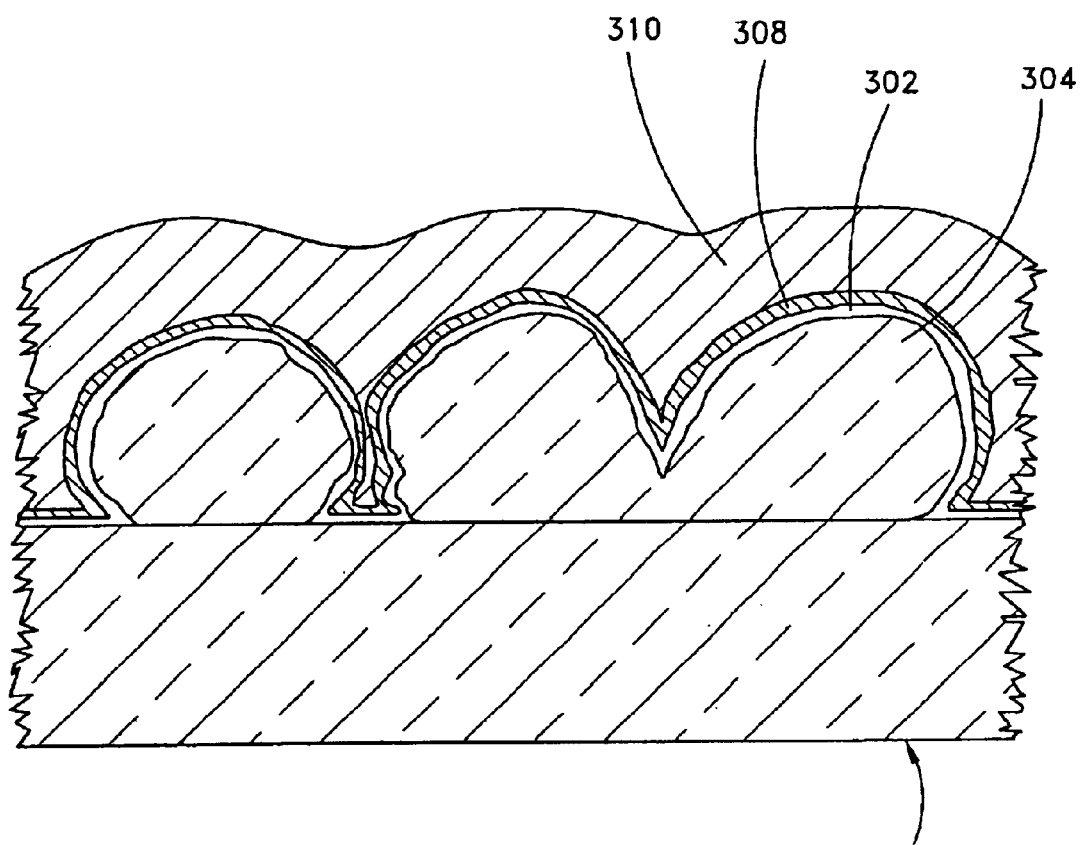
FIG. 10 is a partial, schematic cross-section of a memory cell capacitor with an HSG silicon bottom electrode, including both a conformal ultrathin dielectric and a conformal barrier layer thereover.

Referring now to FIG. 10, a capacitor bottom electrode 300, including HSG silicon 304, has an ultrathin, high k dielectric 302 conforming thereto, as described with respect to FIG. 7. Additionally, FIG. 10 illustrates a top electrode formed over the high k dielectric 302. Advantageously, the top electrode includes an initial conductive thin film 308, formed by ALD directly over the high k dielectric. Since the conductive thin film 308 is deposited by the ALD process described with respect to Table VII and/or Table VIII, the conductive layer 308 conformally coats the capacitor dielectric, thus ensuring full top electrode coverage of the high surface capacitor. At the same time, a remaining portion 310 of the top electrode can be formed by conventional means, such as CVD or PVD, without loss of capacitance.

In one example, where the capacitor dielectric comprises a volatile material such as $Ta_2O_5$, the initial thin conductive film 308 comprises a thin (e.g., between about 10 nm and 30 nm) barrier layer, exemplified by the TiN formed by the process of Table VII. In this case, the remainder 310 of the top electrode preferably includes about another 100 nm of metal nitride to leave an effective thickness for the barrier function. The remaining portion 310 of the top electrode preferably also includes a more conductive material, such as an elemental metal, deposited thereover.

In another example, the initial thin conductive film 308 comprises a thin (e.g., between about 10 nm and 30 nn) elemental metal layer, exemplified by the W formed by the process of Table VIII. In this case, the remainder 310 of the top electrode preferably includes about another 100–500 nm of conductive material and preferably elemental metal to leave an effective thickness for the top electrode.

Although the foregoing invention has been described in terms of certain preferred embodiments, other embodiments will be apparent to those of ordinary skill in the art. For example, while processes are specifically provided for particular dielectric materials, the skilled artisan will readily appreciate that ALD methods can be applied to forming capacitors with other materials. Moreover, although illustrated in connection with particular process flows and structures for memory cell capacitors, the skilled artisan will appreciate variations of such schemes for which the methods disclosed herein will have utility. Additionally, other combinations, omissions, substitutions and modification will be apparent to the skilled artisan, in view of the disclosure herein. Accordingly, the present invention is not intended to be limited by the recitation of the preferred embodiments, but is instead to be defined by reference to the appended claims.

We claim:

1. An integrated circuit having a plurality of memory cells, each memory cell including a capacitor comprising:

a first electrode having a surface conforming to a hemispherical grain morphology;

an ALD-deposited capacitor dielectric layer adjacent to the first electrode and conforming to the hemispherical grain morphology, the capacitor dielectric comprising a material selected from the group consisting of aluminum oxide, titanium oxide, zirconium oxide, niobium oxide, hafnium oxide, silicon oxide and mixtures and compounds thereof; and a second electrode adjacent to and conforming to the hemispherical grain morphology, the second electrode including an ALD-deposited layer directly adjacent to the dielectric layer, wherein the capacitor dielectric layer has a maximum thickness of X at all points over the first electrode and at no point over the first electrode does the capacitor dielectric have a thickness of less than 0.95 times X.

2. The integrated circuit of claim 1, wherein the maximum thickness X of the capacitor dielectric layer at all points over the first electrode is between about 10 Å and 200 Å

3. The integrated circuit of claim 1, wherein the capacitor dielectric layer further comprises a plurality of sublayers.

4. The integrated circuit of claim 3, wherein the sublayers comprise a plurality of sublayers of a first metal oxide alternated with the sublayers of an other metal oxide.

* * * * *

UNITED STATES PATENT AND TRADEMARK OFFICE
CERTIFICATE OF CORRECTION

PATENT NO. : 6,831,315 B2  Page 1 of 1
APPLICATION NO. : 09/791072
DATED : December 14, 2004
INVENTOR(S) : Raaijmakers et al.

It is certified that error appears in the above-identified patent and that said Letters Patent is hereby corrected as shown below:

On title page Item (56) OTHER PUBLICATIONS

On page 2, col. 2, line 28, after "1999" insert --, Pg. 504-506--.

In Col 1, line 13, please delete "Conformability" and insert --conformality-- therefor.

In Col. 2, line 16, after "bottom" insert --electrode--.

In Col. 2, line 21, after "cylinders" insert -- . --.

In Col. 2, line 35, after "lower" insert --electrode--.

In Col. 2, line 66, delete "involve" and insert --involves-- therefor.

In Col. 5, line 23, delete "conformability" and insert --conformality-- therefor.

In Col. 10, line 64, delete "e.g." and insert --e.g.,-- therefor.

In Col. 12, line 61, delete "hafnilum" and insert --hafnium-- therefor.

In Col. 12, line 66, after "purge" insert --step--.

In Col. 14, line 15, delete "15" and insert --115-- therefor.

In Col. 16, line 8, delete "Shermnam" and insert --Sherman-- therefor.

In Col. 22, line 4, after "thereof" insert --.--.

In Col. 23, line 53, delete "chemilsorbs" and insert --chemisorbs-- therefor.

Signed and Sealed this

Eighth Day of August, 2006

JON W. DUDAS
*Director of the United States Patent and Trademark Office*